(12) United States Patent
Simbuerger et al.

(10) Patent No.: US 7,477,105 B2
(45) Date of Patent: Jan. 13, 2009

(54) AMPLIFIER ARRANGEMENT AND METHOD FOR AMPLIFYING A SIGNAL

(75) Inventors: Werner Simbuerger, Haar (DE); Winfried Bakalski, München (DE); Ronald Thüringer, München (DE); Marc Jan Georges Tiebout, München (DE)

(73) Assignee: Infineon Technologies AG, Munich (DE)

( * ) Notice: Subject to any disclaimer, the term of this patent is extended or adjusted under 35 U.S.C. 154(b) by 112 days.

(21) Appl. No.: 11/517,782

(22) Filed: Sep. 8, 2006

(65) Prior Publication Data

US 2008/0061886 A1 Mar. 13, 2008

(51) Int. Cl.
*H03F 3/68* (2006.01)
(52) U.S. Cl. .................. 330/295; 330/124 R; 330/195
(58) Field of Classification Search ................ 330/295, 330/124 R, 195, 147, 148
See application file for complete search history.

(56) References Cited

U.S. PATENT DOCUMENTS

| | | | |
|---|---|---|---|
| 5,742,205 A * | 4/1998 | Cowen et al. ............... 330/269 | |
| 6,392,488 B1 | 5/2002 | Dupuis | |
| 6,448,847 B1 | 9/2002 | Paul | |
| 6,462,620 B1 | 10/2002 | Dupuis | |
| 6,509,799 B1 * | 1/2003 | Franca-Neto ............... 330/305 |
| 6,515,547 B2 * | 2/2003 | Sowlati ...................... 330/311 |
| 6,998,921 B2 * | 2/2006 | Behzad ...................... 330/311 |
| 7,276,976 B2 * | 10/2007 | Oh et al. .................... 330/311 |
| 7,315,212 B2 * | 1/2008 | Floyd et al. ................ 330/305 |
| 2005/0271161 A1 | 12/2005 | Staszewski | |
| 2006/0038710 A1 | 2/2006 | Staszewski | |
| 2006/0078067 A1 | 4/2006 | Brobston | |
| 2007/0024480 A1 | 2/2007 | Schwoerer | |

FOREIGN PATENT DOCUMENTS

| DE | 101 04 260 C2 | 5/2003 |
|---|---|---|
| WO | WO 02/23716 A2 | 3/2002 |
| WO | WO 03/017477 A2 | 2/2003 |

* cited by examiner

*Primary Examiner*—Patricia Nguyen
(74) *Attorney, Agent, or Firm*—Eschweiler & Associates, LLC

(57) ABSTRACT

A power amplifier comprises a control signal generator providing a first and a second signal, a first amplifier comprising a first transistor and a first cascode transistor for the amplification of the first signal, a second amplifier comprising a second transistor and a second cascode transistor for the amplification of the second signal, and an output coupler which couples an output of the first amplifier and an output of the second amplifier to an output terminal of the amplifier arrangement.

27 Claims, 14 Drawing Sheets

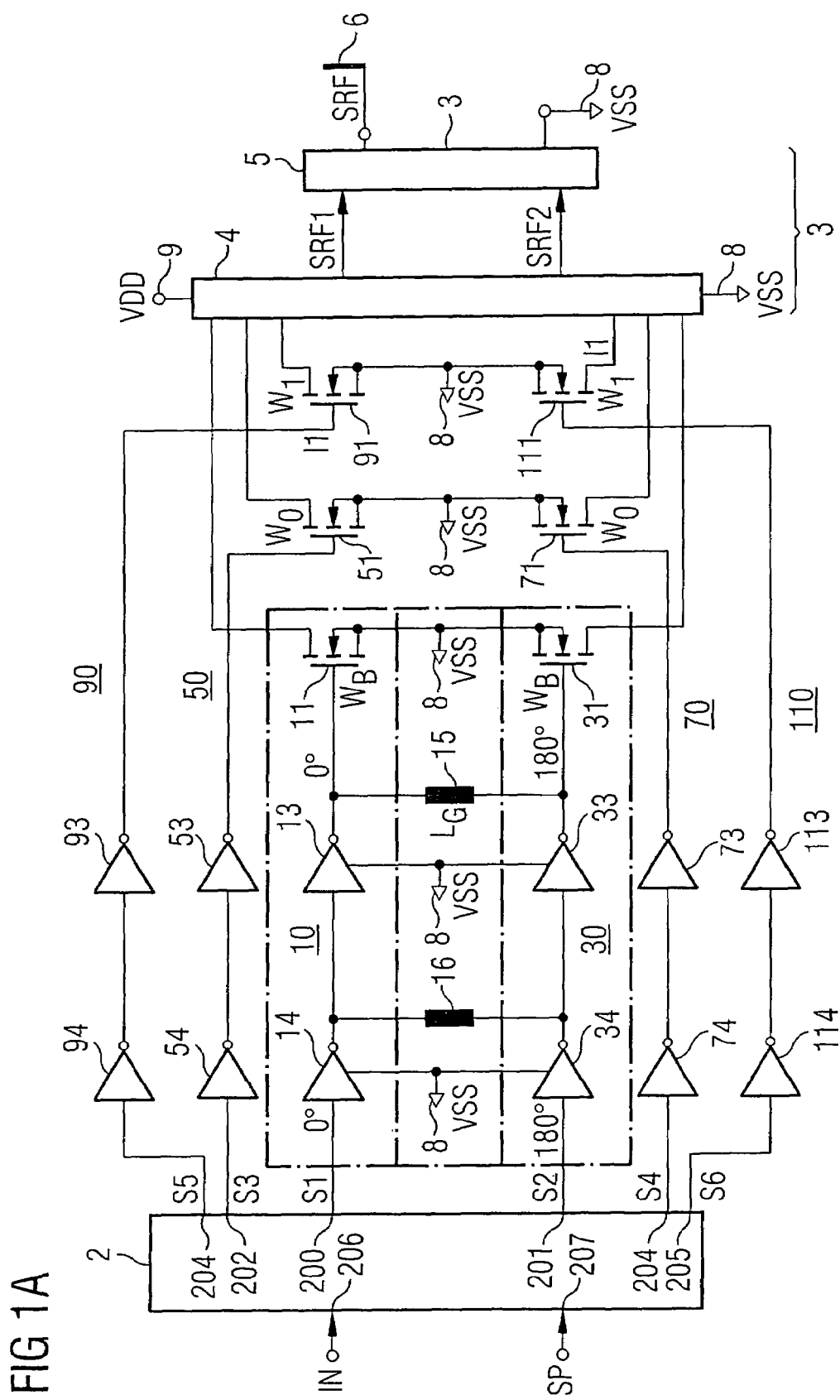

| $W_B$ | 0.3162 |
|---|---|
| $W_0$ | 0.6838 |

| Power control | Gain in [dB] | spec. gate width | Approx. gain in [dB] | Approx. gate width |
|---|---|---|---|---|
| 0 | -10 | 0.3162 | -10.0 | 0.3162 |
| 1 | 0 | 1.0000 | 0.0 | 1.0000 |

| $W_B$ | 0.4302 |
|---|---|
| $W_0$ | 0.0822 |
| $W_1$ | 0.1639 |
| $W_2$ | 0.3236 |

| Power control | Gain in [dB] | spec. gate width | Approx. gain in [dB] | Approx. gate width |
|---|---|---|---|---|
| 0 | -7 | 0.4467 | -7.3 | 0.4302 |
| 1 | -6 | 0.5012 | -5.8 | 0.5124 |
| 2 | -5 | 0.5623 | -4.5 | 0.5941 |
| 3 | -4 | 0.6310 | -3.4 | 0.6764 |
| 4 | -3 | 0.7079 | -2.5 | 0.7538 |
| 5 | -2 | 0.7943 | -1.6 | 0.8361 |
| 6 | -1 | 0.8913 | -0.7 | 0.9178 |
| 7 | 0 | 1.0000 | 0.0 | 1.0000 |

| | |
|---|---|
| $W_B$ | 0.0936 |
| $W_0$ | 0.0629 |
| $W_1$ | 0.1253 |
| $W_2$ | 0.2474 |
| $W_3$ | 0.4708 |

| Power control | Gain in [dB] | spec. gate width | Approx. gain in [dB] | Approx. gate width |
|---|---|---|---|---|
| 0 | -15 | 0.1778 | -20.6 | 0.0936 |
| 1 | -14 | 0.1995 | -16.1 | 0.1564 |
| 2 | -13 | 0.2239 | -13.2 | 0.2189 |
| 3 | -12 | 0.2512 | -11.0 | 0.2818 |
| 4 | -11 | 0.2818 | -9.3 | 0.3410 |
| 5 | -10 | 0.3162 | -7.9 | 0.4039 |
| 6 | -9 | 0.3548 | -6.6 | 0.4663 |
| 7 | -8 | 0.3981 | -5.5 | 0.5292 |
| 8 | -7 | 0.4467 | -5.0 | 0.5643 |
| 9 | -6 | 0.5012 | -4.1 | 0.6272 |
| 10 | -5 | 0.5623 | -3.2 | 0.6897 |
| 11 | -4 | 0.6310 | -2.5 | 0.7526 |
| 12 | -3 | 0.7079 | -1.8 | 0.8118 |
| 13 | -2 | 0.7943 | -1.2 | 0.8747 |
| 14 | -1 | 0.8913 | -0.6 | 0.9371 |
| 15 | 0 | 1.0000 | 0.0 | 1.0000 |

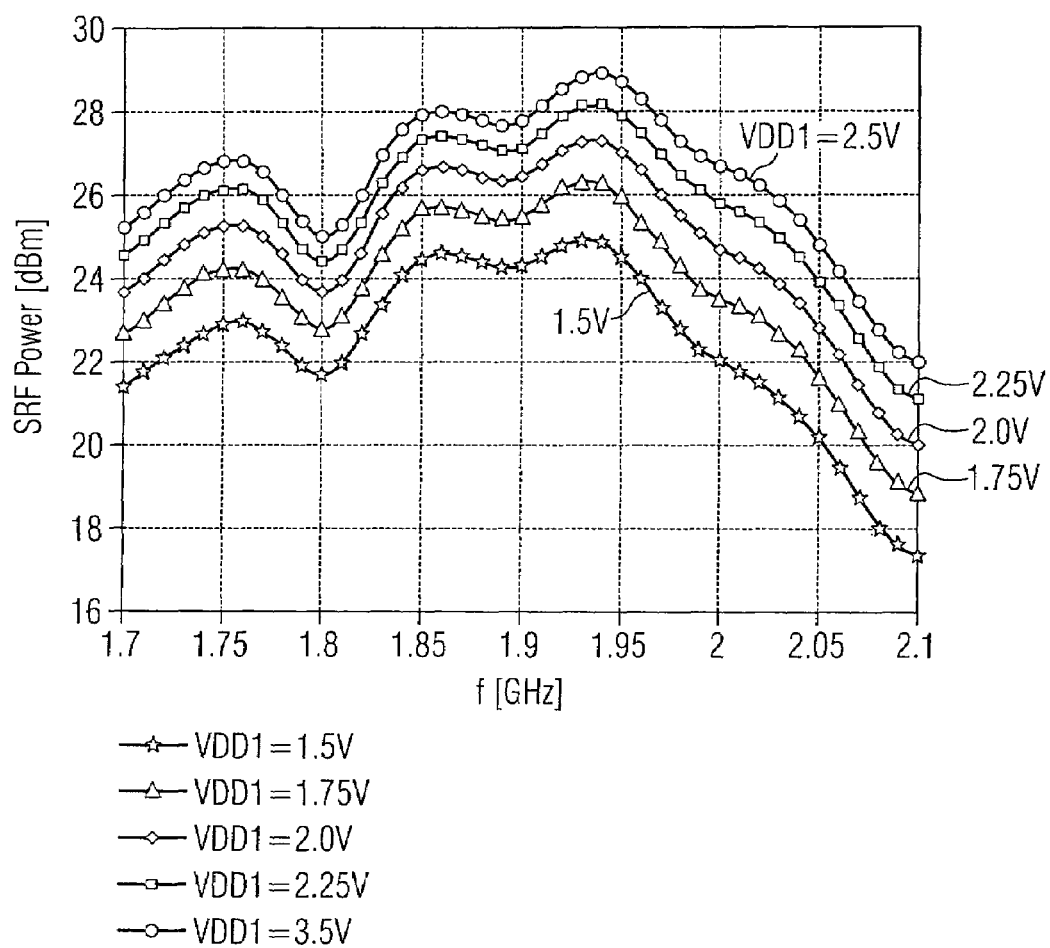

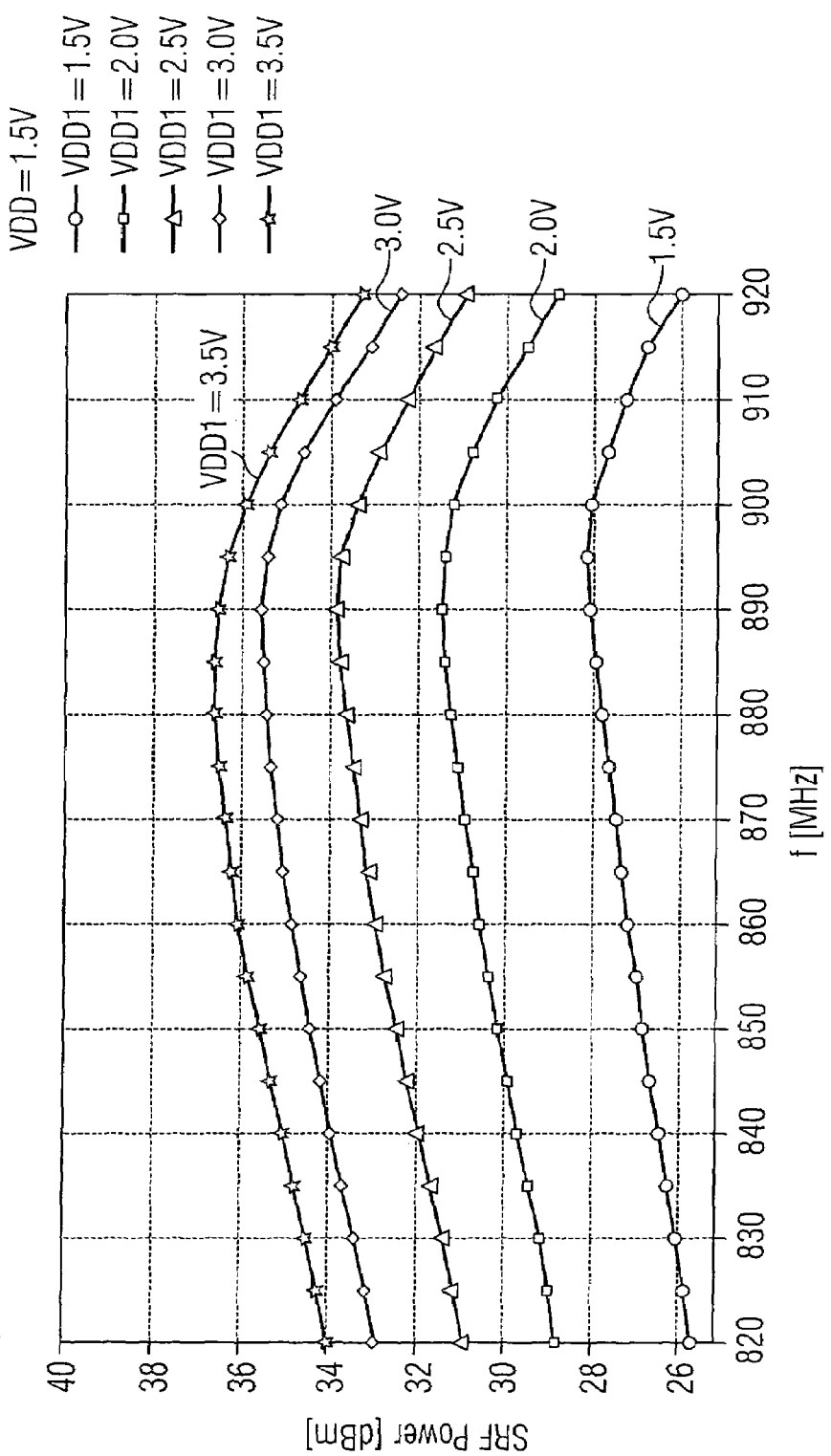

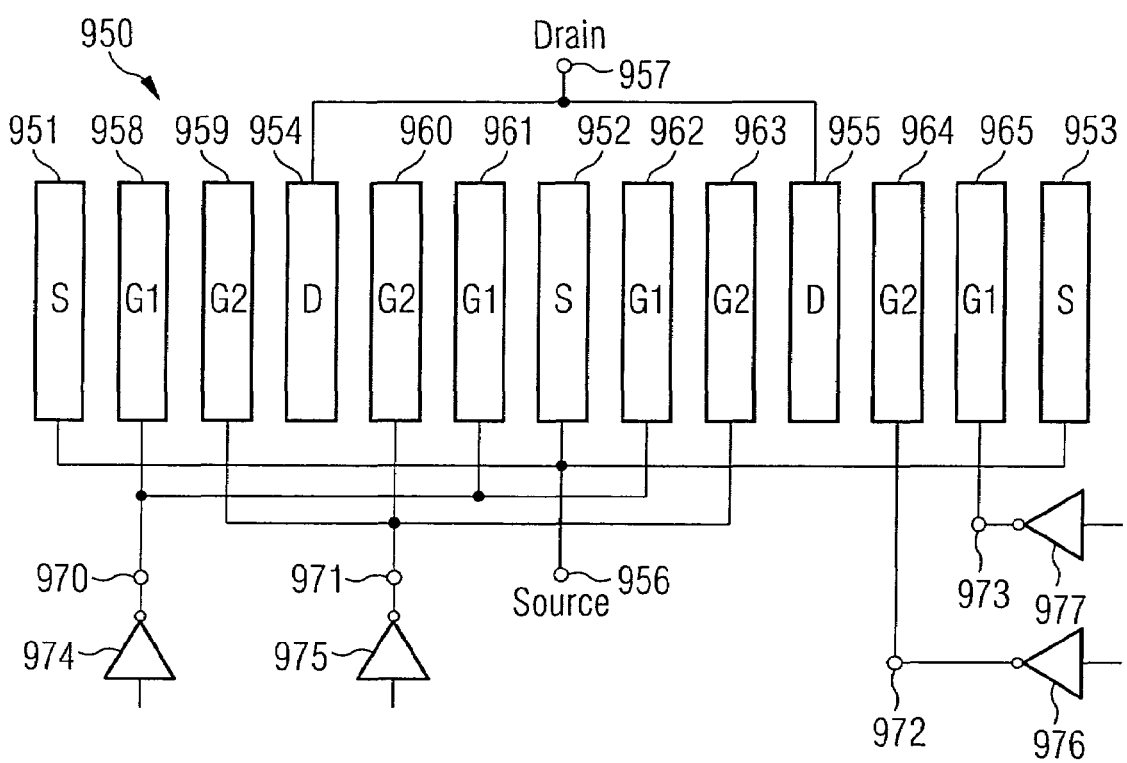

AMPLIFIER ARRANGEMENT AND METHOD FOR AMPLIFYING A SIGNAL

FIELD OF THE INVENTION

The invention relates to the field of electronics and primarily to an amplifier arrangement comprising a first branch and a second branch, and to a method for amplifying a signal.

BACKGROUND OF THE INVENTION

Amplifier arrangements are used in a number of areas of electronics such as, for example, communications technology and industrial electronics. An amplifier arrangement may be provided as an individual, integrated circuit. An amplifier arrangement may also be realized together with further circuit modules on an extensive integrated circuit.

A power amplifier is used, for example, in mobile communication devices. As mobile communication devices use more and more digital circuitry, there is a need for a power amplifier which can be controlled by digital signals.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

According to one embodiment of the invention, an amplifier arrangement is disclosed, and comprises multiple branches. In one example each branch is coupled to a common current combiner. In accordance with a desired power, none, one or both branches are active and participate in forming the output signal.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE INDIVIDUAL DRAWINGS

The invention is explained in more detail below by using a plurality of exemplary embodiments with reference to the figures. Functionally or operatively identical structural elements bear identical reference symbols.

FIGS. 1A to 1C are schematic diagrams illustrating exemplary embodiments of an amplifier arrangement comprising six branches.

FIGS. 6A and 6B are a schematic diagram and a graph illustrating an additional exemplary embodiment of an amplifier arrangement comprising two branches and measurement results obtained using the amplifier arrangement.

FIGS. 7A and 7B are a schematic diagram and graph illustrating an additional exemplary embodiment of an amplifier arrangement comprising two branches and measurement results obtained using the amplifier arrangement.

FIGS. 8A to 8G are diagrams illustrating exemplary embodiments of a multi-finger transistor in accordance with the invention.

DETAILED DESCRIPTION OF THE INVENTION

Figure 1B:
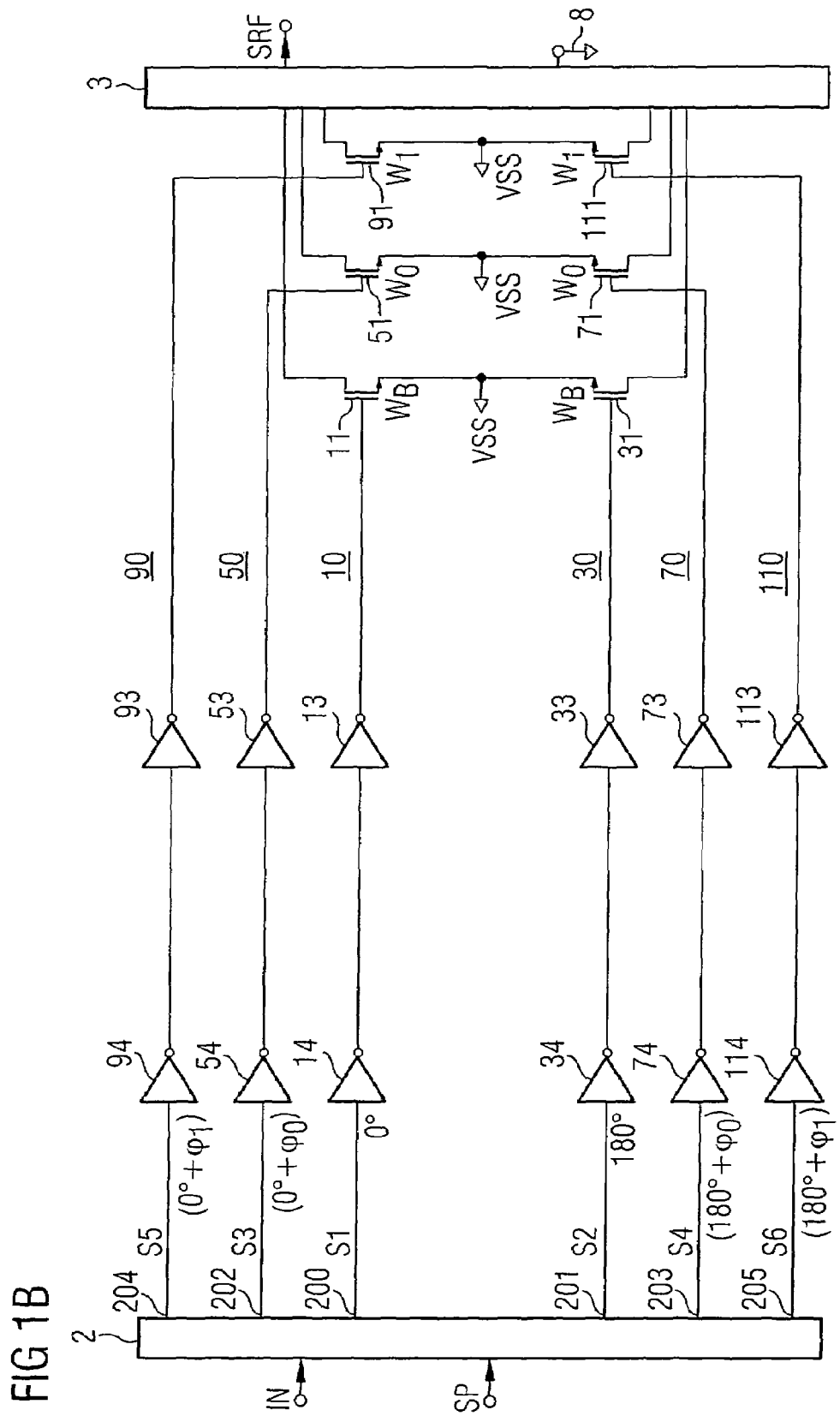

Components having the same function and/or effect have the same reference symbols. Where the components and functions of the circuit parts match, their description will not be repeated for each of the following figures.

FIG. 1A shows an exemplary embodiment of an amplifier arrangement comprising a control logic 2, a first, a second, a third, a fourth, a fifth and a sixth branch 30, 50, 70, 90, 110 and a current combiner 3. The control logic 2 comprises six output terminals 200 to 205 and two input terminals 206, 207. A first branch 10 comprises a first transistor 11, a first inverter 13 and a further inverter 14. The output terminal 200 of the control logic 2 is coupled to an input terminal of the further inverter 14. An output terminal of the further inverter 14 is coupled by the first inverter 13 to a control terminal of the first transistor 11. The first terminal of the first transistor 11 is connected to a reference potential terminal 8. A second terminal of the first transistor 11 is coupled to the current combiner 3. The second branch 30 of the amplifier arrangement comprises a second transistor 31, a second inverter 33 and a further inverter 34. The output terminal 201 of the control logic 2 is coupled to an input terminal of the further inverter 34. An output terminal of the further inverter 34 is coupled by the second inverter 33 to a control terminal of the second transistor 31. A first terminal of the second transistor 31 is connected to the reference potential terminal 8 and a second terminal of the second transistor 31 is coupled to the current combiner 3. The control terminal of the first transistor 11 is coupled to the control terminal of the second transistor 31 via the first impedance 15. The first impedance 15 in this embodiment comprises a coil. An input terminal of the first inverter 13 is coupled to an input terminal of the second inverter 33 via a second impedance 16. The second impedance 16 also comprises a coil in this example.

The third branch 50 of the amplifier arrangement comprises a third transistor 51 and a third inverter 53, a further inverter 54. The output terminal 202 of the control logic 2 is coupled to a control terminal of the third transistor 51 by a series circuit comprising the third inverter 53 and the further inverter 54. A first terminal of the third transistor 51 is connected to the reference potential terminal 8 and a second terminal of the third transistor 51 is coupled to the current combiner 3. A fourth branch 70 of the amplifier arrangement comprises a fourth transistor 71, a fourth inverter 73 and a further inverter 74. The output terminal 203 of the control logic 2 is coupled to an input terminal of the fourth transistor 71 by a series circuit comprising the fourth inverter 73 and the further inverter 74. A first terminal of the fourth transistor 71 is coupled to the current combiner 3 and a second terminal of the fourth transistor 71 is coupled to the current combiner 3.

A fifth branch 90 of the amplifier arrangement comprises a fifth transistor 91, a fifth inverter 93 and a further inverter 94. The output terminal 204 of the control logic 2 is coupled to a control terminal of the fifth transistor 91 via a series circuit comprising the fifth inverter 93 and the further inverter 94. A first terminal of the fifth transistor 91 is connected to the reference potential terminal 8 and a second terminal of the fifth transistor 91 is coupled to the current combiner 3. A sixth branch 110 of the amplifier arrangement comprises a sixth transistor 111, a sixth inverter 113 and a further inverter 114. The output terminal 205 of the control logic 2 is coupled to a control terminal of the sixth transistor 111 via a series circuit comprising the sixth inverter 113 and the further inverter 114. A first terminal of the sixth transistor 111 is connected to the reference potential terminal 8 and a second terminal of the sixth transistor 111 is coupled to the current combiner 3.

The current combiner 3 comprises a circuitry 4 for impedance transformation and a Balun (BALanced-Unbalanced) 5. The second terminals of the six transistors 11, 31, 51, 71, 91, 111 are connected to input terminals of the circuitry 4 for impedance transformation. The circuitry 4 for impedance transformation comprises two output terminals, which are connected to two input terminals of the balun 5. An output terminal of the balun 5 is coupled to an antenna 6. The balun 5 is also connected to the reference potential terminal 8.

The control logic 2 receives a data signal IN at the first input terminal 206 of the control logic 2 and a power control signal SP at the second input terminal 207 of the control logic 2. By the use of the data signal IN and of the power control signal SP, the control logic 2 generates six signals S1 to S6 which are provided at the corresponding output terminals 200 to 205. The first signal S1 and the second signal S2 have a phase difference of approximately 180 degrees with respect to each other. The first signal S1 is amplified by the further inverter 14 and the inverter 13 so that an amplified first signal S1 controls the control terminal of the first transistor 11. In an analogous way, the second signal S2 is amplified by the second inverter 33 and the further inverter 34 and controls the control terminal of the second transistor 31. The current flowing through the first transistor 11 is controlled by the signal at the control terminal of the first transistor 11 and also a current flowing through the second transistor 31 is controlled by the signal at the control terminal of the second transistor 31. The first transistor 11 and the second transistor 31 have the same capability for driving a current. The first and the second transistor 11, 31 in this embodiment comprise a width WB.

The four signals S3 to S6 are amplified by the inverters comprised by the third, the fourth, the fifth, and the sixth branches 50, 70, 90, 110, respectively, and control the control terminals of the third, the fourth, the fifth, and the sixth transistors 51, 71, 91, 111, respectively, and, therefore, control a current which flows from the current combiner 3 through the four transistors 51, 71, 91, 111 to the reference potential terminal 8. The third signal S3 has a phase difference of approximately 180 degrees with respect to the fourth signal S4. In an analogous manner, the fifth signal S5 has a phase difference of approximately 180 degrees with respect to the sixth signal S6.

The six signals S1 to S6 are generated in dependency of or as a function of the power control signal SP. To achieve a maximum power at the output terminal of the current combiner 3, the six signals S1 to S6 are generated using the data signal IN. To achieve the maximum power, the first, the third, and the fifth signal S1, S3, S5 are equal and the second, the fourth, and the sixth signal S2, S4, S6 are also equal. To achieve a smaller output power at the output terminal of the current combiner 3, the fifth and the sixth transistor 91, 111 are switched off, for example, by an appropriate constant value of the fifth and the sixth signal S5, S6. The six transistors are implemented in this embodiment using metal-oxide-semiconductor field-effect transistors, (MOSFETs). The six MOSFETs are designed in this exemplary embodiment as n-channel MOSFETs with a positive threshold value. Therefore, a fifth and a sixth signal S5, S6 with a value of 0 switches the fifth and the sixth transistor 91, 111 off.

The circuitry 4 of the current combiner 3 generates a signal SRF1 at a first output terminal and a second signal SRF2 at a second output terminal using the current flowing through the six transistors 11, 31, 51, 71, 91, 111. The balun 5 generates a radio frequency signal SRF by the use of the first and the second signal SRF1, SRF2. The radio frequency signal SRF is provided to the antenna 6.

According to an embodiment, the first and the second branch 10, 30 can be implemented as a so-called base amplifier which contributes with a gate width WB to the radio frequency signal SRF. The third and the fourth branches 50, 70 contribute with a gate width W0 and the fifth and the sixth branches 90, 110 contribute with a gate width W1 to the radio frequency signal SRF. The contribution may be implemented, for example, in a binary digit configuration. The gate width W0 can be the gate width of the least significant bit amplifier.

In an embodiment, the six branches can be switched on and off by the use of the control logic 2 in such a way that the necessary phase and amplitude of the radio frequency signal SRF can be achieved. The amplifier arrangement can also be used as a power digital-to-analog converter. The first and the second impedances 15, 16 are used for compensation of parasitic capacitances of the input terminals of the inverters 13, 33 and the transistors 11, 31.

In one embodiment, the 12 inverters 13, 14, 33, 34, 53, 54, 73, 74, 93, 94, 113, 94, 114 are scaled with reference to the widths of the six transistors. The capability to provide a current of the six inverters 13, 33, 53, 73, 93, 113 corresponds to the widths WB, W0, W1 of these six transistors 11, 31, 51, 71, 91, 111. The six inverters 13, 33, 53, 73, 93, 113 have a higher capability to provide a current in comparison to the six further inverters 14, 34, 54, 74, 94, 114.

In an embodiment, the first, the third and the fifth signals S1, S3, S5 have approximately the same phase. The second, the fourth and the sixth signals S1, S4, S6 also have approximately the same phase which has a phase difference of 180 degrees with respect to the phase of the first, the third and the fifth signals S1, S3, S5.

In a further development, a first phase difference $\phi 0$ between the third signal S3 and the first signal S1 is represented by $\phi 0$. The fourth signal S4 has the first phase difference $\phi 0$ with respect to the second signal S2. A second phase difference $\phi 1$ between the fifth signal S5 and the first signal S1 is represented by $\phi 1$. The sixth signal S6 has the phase difference $\phi 1$ with respect to the second signal S2.

In an alternative embodiment, the third signal has a phase difference of 90 degrees with respect to the first signal S1 and the fourth signal S4 has a phase difference of approximately 270 degrees with respect to the first signal S1. The first, the second, the third, and the fourth transistor 11, 31, 51, 71 show the same capability for driving a current. The four transistors 11, 31, 51, 71 show the same width WB. By the use of four different phases, an alternative current combiner 3 can be obtained in a more cost-effective way in comparison with the current combiner 3 designed for combining signals comprising a phase difference of 180 degrees.

In an alternative embodiment, which is not shown, the first and the second impedances 15, 16 are realized using generalized impedance converters or gyrators.

In an alternative embodiment, which is not shown, the input terminals of the third and the fourth transistor 51, 71 and the input terminals of the fifth and the sixth transistor 91, 111 are also coupled together by impedances which comprise coils. In an alternative embodiment, the input terminals of the third and the fourth inverter 53, 73 and the input terminals of the fifth and the sixth inverter 93, 113 are also connected together using impedances which comprise coils.

In another alternative embodiment, which is not shown, the amplifier arrangement comprises further branches which are realized similarly in comparison to the first and the second branch 10, 30. The further branches are connected in parallel to the six branches 10, 30, 50, 70, 90, 110.

In an alternative embodiment, the six transistors 11, 31, 51, 71, 91, 111 are implemented as p-channel MOSFETs.

In an alternative embodiment, the coil which is comprised by the first impedance 15 is a switchable coil and the coil comprised by the second impedance 16 is also a switchable coil. MOSFETs can be coupled to the coils to switch on and off turns or winding sections of the coils.

FIG. 1B shows another exemplary embodiment of an amplifier arrangement comprising the control logic 2, the first, the second, the third, the fourth, the fifth and the sixth branch 10, 30, 50, 70, 90, 110 and a current combiner 3. The first branch 10 comprises the first transistor 11, the first inverter 13 and the further inverter 14. The first branch 10 couples the output terminal 200 of the control logic 2 to an input terminal of the current combiner 3. The second, the third, the fourth, the fifth and the sixth branches 30, 50, 70, 90, 110 are implemented in analog manner to the first branch 10. According to the exemplary embodiment shown in FIG. 1B, the different branches 10, 30, 50, 70, 90, 110 are not coupled together either directly or via impedances. A coupling is only provided by the control logic 2 and the current combiner 3.

The first transistor 11 has a width WB of the gate and of the channel, respectively. The second transistor 31 has the same width WB. The third and the fourth transistors 51, 71 have a further width W0. The fifth and the sixth transistors 91, 111 have an additional further width W1.

The control logic 2 provides, at the six output terminals 200 to 205 of the control logic 2, six signals S1, S2, S3, S4, S5, S6 which are fed to the six branches 10, 30, 50, 70, 90, 110, respectively. The second signal S2 equals to the first signal S1 besides a phase difference of approximately 180 degrees with respect to each other. The third signal S3 and the first signal S1 have the first phase difference $\phi 0$ with respect to each other. The fourth signal S4 and the first signal S1 have a phase difference of approximately 180 degrees plus the first phase difference $\phi 0$ with respect to each other. The fifth signal S5 and the first signal S1 have the second phase difference $\phi 1$ with respect to each other. The sixth signal S6 and the first signal S1 have a phase difference of approximately 180 degrees plus the second phase difference $\phi 1$ with respect to each other.

In an embodiment, the first, the third and the fifth signal S1, S3, S5 have approximately the same phase. The second, the fourth, and the sixth signal S2, S4, S6 have approximately the same further phase. The power of the radio frequency signal SRF depends on the branches which are switched to active by the signals S1 to S6.

In one embodiment, the current combiner 3 comprises the circuitry 4 for impedance transmission and the balun 5 which are shown in FIG. 1A.

In an embodiment, the six further inverters 14, 34, 54, 74, 94, 114 and the six inverters 13, 33, 53, 73, 93, 113 do not comprise transistors of the same size. The capability for driving a current of the six inverters 13, 33, 53, 73, 93, 113 is higher than the capability for driving a current of the six further inverters 14, 34, 54, 74, 94, 114. The widths of the transistors of the 12 inverters depend on the widths of the first to the sixth transistor 11, 31, 51, 71, 91, 111 so that the 12 inverters are scaled according to the widths of the six transistors 11, 31, 51, 71, 91, 111.

Figure 1C:
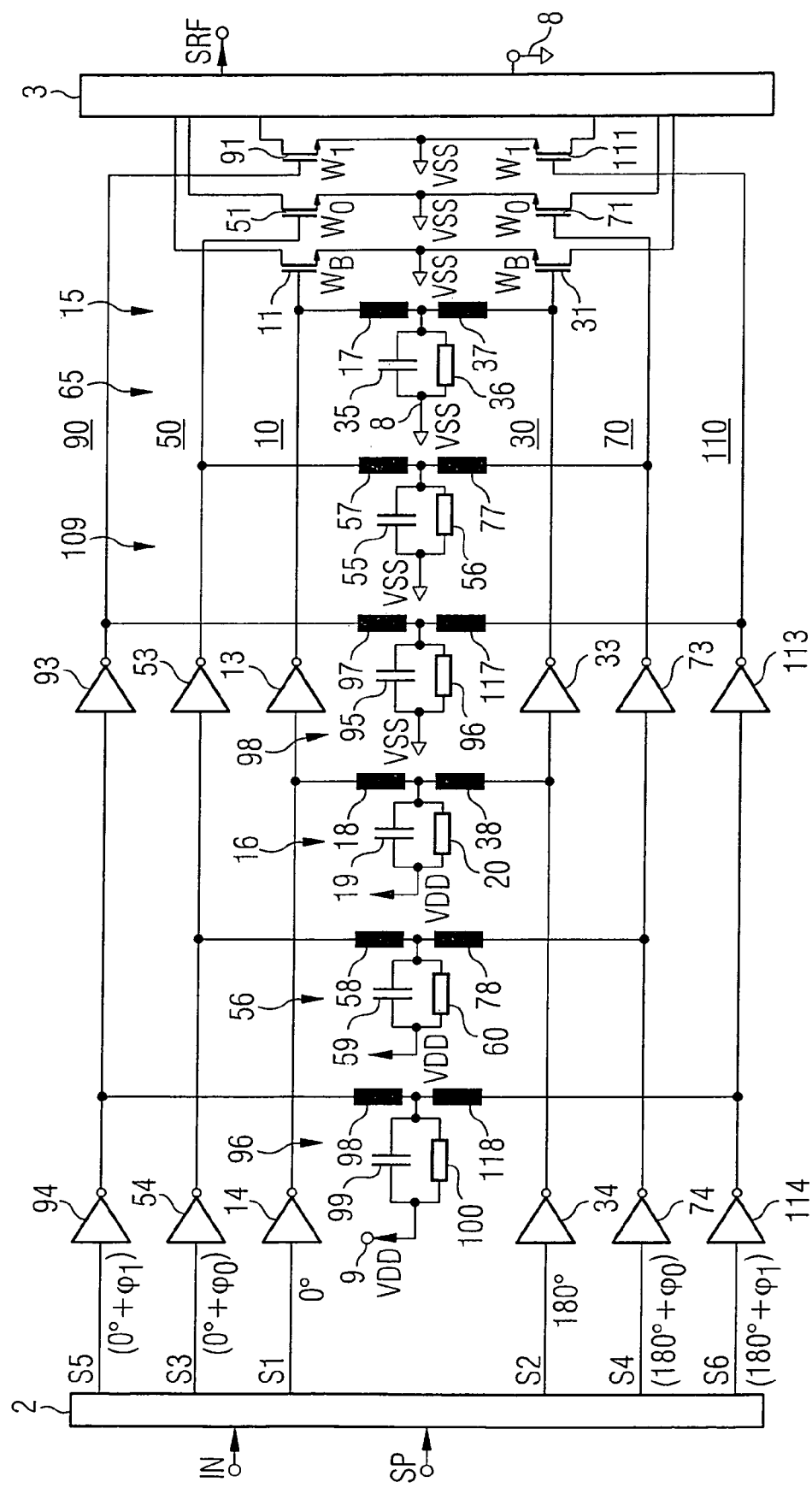

FIG. 1C shows another exemplary embodiment of an amplifier arrangement which is a further development of the amplifier arrangement shown in FIG. 1A. According to FIG. 1C not only the first transistor 11 and the second transistor 31 are coupled together by the first impedance 15 but also the third and the fourth transistor 51, 71 are coupled together by a further impedance 65. The fifth and the sixth transistor 91, 111 are coupled together by an additional impedance 105. Also not only the first and the second inverter 13, 33 are coupled together by the second impedance 16 but also the third and the fourth inverter 53, 73 as well as the fifth and the sixth inverter 93, 113 are coupled together, respectively, by similar impedances 56, 96. The control terminal of the third transistor 51 is coupled to the control terminal of the fourth transistor 71 via a series circuit of two coils 57, 77. A node between the two coils 57, 77 is coupled to the reference potential terminal 8 via a parallel circuit of a capacitor 55 and a resistor 56. In an analog way the control terminals of the fifth and the sixth transistors 91, 111 are coupled together via the further impedance 105 which comprises two coils 97, 117. A node between the two coils 97, 117 is coupled to the reference potential terminal 8 by a parallel circuit of a capacitor 95 and a resistor 96.

The input terminal of the third inverter 53 is coupled to the input terminal of the fourth inverter 73 via the impedance 56, comprising two coils 58, 78. A node between the two coils 58, 78 is coupled to the supply voltage terminal 9 via a parallel circuit of a capacitor 59 and a resistor 60. An input terminal of the fifth inverter 93 is coupled to an input terminal of the sixth inverter 113 via the impedance 96, comprising two coils 98, 118. A node between the two coils 98, 118 is coupled to the supply voltage terminal 9 via a parallel circuit comprising a capacitor 99 and a resistor 100.

The six signals S1 to S6 which are provided by the logic circuit 2 are generated in the way the six signals S1 to S6 are generated according to FIG. 1B.

In one embodiment, the six inverters 13, 33, 53, 73, 93, 113 have a higher capability for driving a circuit in comparison to the six inverters 14, 34, 54, 74, 94, 114. The inverters of each branch are scaled in accordance with the width of the transistor to which they are coupled to in the respective branch.

Figure 2:
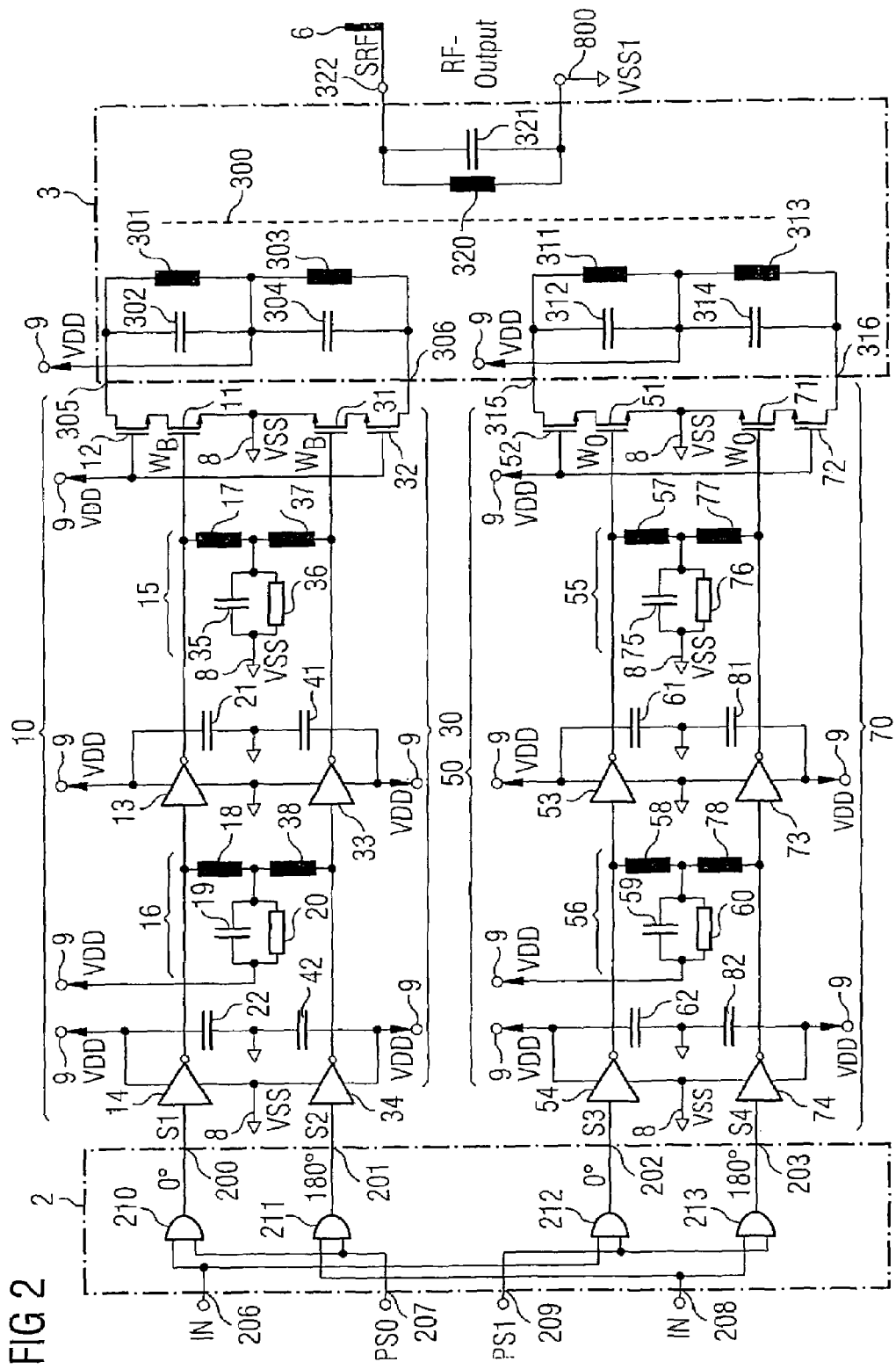
FIG. 2 is a schematic diagram illustrating another exemplary embodiment of an amplifier arrangement with four branches comprising cascode transistors.

FIG. 2 shows another exemplary embodiment of an amplifier arrangement. The amplifier arrangement comprises four branches 10, 30, 50, 70. In comparison to the first branch 10 according to FIGS. 1A to 1C, the first branch 10 comprises a first cascode transistor 12 which couples the second terminal of the first transistor 11 to an input terminal 305 of the current combiner 3. In an analogous way, a second, a third, and a fourth cascode transistor 32, 52, 72 couple the second terminals of the second, the third, and the fourth transistors 31, 51, 71 to a second, a third, and a fourth input terminal 306, 315, 316 of the current combiner 3, respectively.

The first impedance 15 comprises, according to FIG. 2, two impedances 17, 37 which are coupled in series between the control terminals of the first and the second transistor 11, 31. A node between the impedance 17 and the impedance 37 is coupled to the reference potential terminal 8 via a parallel circuit of a capacitance 35 and a resistor 36. The impedances 17, 37 are implemented in this embodiment using coils.

The second impedance 16 is similarly designed using a series circuit of two impedances 18, 38 which are coupled between the input terminals of the first and the second inverter 30, 33. A node between the impedance 18 and the impedance 38 is coupled to a supply voltage terminal 9 via a parallel circuit of a capacitor 19 and a resistor 20. The impedances 18, 38 are realized in this embodiment using coils.

The input terminals of the four cascode transistors 12, 32, 52, 72 are connected to the supply voltage terminal 9, so that the four cascode transistors 12, 32, 52, 72 show the maximum conductivity.

The control logic 2 comprises four AND gates 210 to 213. The first input terminal 206 and the second input terminal 207 of the control logic 2 are coupled to the input terminals of the first AND gate 210. An output terminal of the AND gate 210 is coupled to the output terminal 200 of the control logic 2. The second input terminal 207 and a third input terminal 208 of the control logic 2 are connected to the input terminals of the second AND gate 211 which comprises an output terminal which is connected to the second output terminal 201 of the control logic 2. The first input terminal 206 and a fourth input terminal 209 of the control logic 2 are connected to the input terminals of the third AND gate 212 which comprises an output terminal which is connected to the third output terminal 202. The third input terminal 208 and the fourth input terminal 209 are connected to the input terminals of the fourth AND gate 213. An output terminal of the fourth AND gate 213 is coupled to the fourth output terminal 203 of the control logic 2.

The current combiner 3 comprises a transformer 300 with two output terminals and six input terminals. The transformer comprises five coils 301, 303, 311, 313, 320. The first coil 301 couples a second terminal of the first cascode transistor 12 to the supply voltage terminal 9. A second terminal of the second cascode transistor 32 is coupled to the supply voltage terminal 9 via the second coil 303. A second terminal of the third cascode transistor 52 is coupled to the supply terminal 9 via the third coil and a second terminal of the fourth cascode transistor 72 is coupled to the supply terminal 9 via the fourth coil 313. Five capacitors 302, 304, 312, 314, 321 are connected parallel to the five coils 301, 303, 311, 313, 320, respectively.

A data signal IN is applied to the first input terminal 206 of the control logic 2. An inverted data signal INN is supplied to the third input terminal 208. A power-select signal PS0 is provided to the second input terminal 207 and a second power-select signal PS1 is applied to the fourth input terminal 209 of the control logic 2. The first and the third signal S1, S3 depend on the data signal IN, while the second and the fourth signal S2, S4 depend on the inverted data signal INN. Therefore, there is a phase difference of 180 degrees between the first signal S1 and the second signal S2 and also between the third signals S3 and the fourth signal S4.

The power of the radio frequency signal SRF at the output terminal 322 of the current combiner 3 depends on the first and the second power-select signal PS1, PS2. If both signals PS1, PS2 are received with a value 1, a maximum power is achieved at the output terminal 322 of the current combiner 3. If both signals PS1, PS2 equal 0, there is no output at the output terminal 322. If one of the two power-select signals PS0, PS2 equal 0 and the other of the two signals PS0, PS1 equal 1, an intermediate value for the output power of the frequency signal SRF at the output terminal 222 can be achieved.

The first, the second, the third, and the fourth transistor 11, 31, 51, 71 are isolated from the output terminal 322 via the cascode transistors 12, 32, 52, 72, respectively, and the transformer 300.

The balun 5 is implemented, according to FIG. 2, using the transformer 300. It is an advantage of a balun 5 that the differential signals provided at the four input terminals 305, 306, 315, 316 of the current combiner 3 are converted to an arrangement with a single-ended output 322 while the other output terminal 323 is connected to a reference-potential terminal 800.

In one embodiment, the reference-potential terminal 8 is connected to the further reference-potential terminal 800. In an alternative embodiment, the two reference-potential terminals 8, 800 are not connected together and are set independently of each other.

In an alternative embodiment, which is not shown, the input terminals of the cascode transistors 12, 32, 52, 72 are not directly connected to the supply voltage terminal 9. The control terminals of these four cascode transistors 12, 32, 52, 72 are coupled to further output terminals of the control logic 2. In this way, the power of the radio frequency signal SRF can be further controlled by setting the conductivity of the four cascode transistors 12, 32, 52, 72.

In an alternative embodiment, which is not shown, the transformer is replaced by a transformation network which may comprise capacitors and coils. The transformation network may comprise programmable components, switchable components or tunable components.

Figures 3A, 3B, 4A, 4B, 4C:
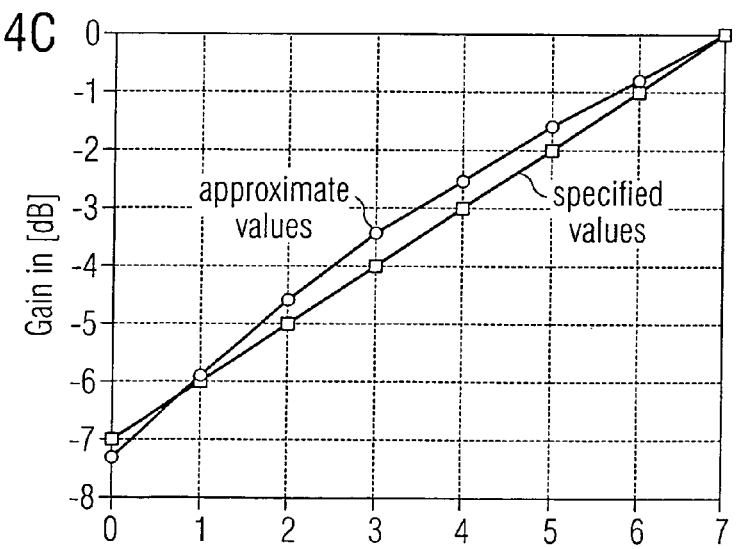
FIGS. 3A and 3B are exemplary tables illustrating a width of transistors in an amplifier arrangement for two gain levels.
FIGS. 4A to 4C are exemplary tables illustrating a width of transistors of an amplifier arrangement for eight gain levels, and a graph associated therewith.

FIGS. 3A and 3B show exemplary tables comprising a width of transistors in an amplifier arrangement for two gain levels. The power P of the radio frequency signal SRF which is transferred to a load resistor RL is related to the current of the radio frequency signal SRF by the following equation:

$$P = RL \cdot I^2,$$

wherein P is the power of the radio frequency signal SRF, RL is the value of the load resistor, and I is the current value of the radio frequency signal SRF. In the case where the first to the sixth transistors 11, 31, 51, 71, 91, 111 are implemented as MOSFETs, the power P1 generated by the use of the first transistor 11 is related to the power P2 generated by the third transistor 51 according to the following equation:

$$\frac{P2}{P1} = 10^{k/10} = \left(\frac{I2}{I1}\right)^2 = \left(\frac{W2}{W1}\right)^2,$$

wherein I2 is the current value generated by the third transistor 51, I1 is the current value generated by the first transistor 11, W2 is the width of the third transistor 51, W1 is the width of the first transistor 11, and k is the power ratio in dB. The width of a MOSFET can also be understood as the gate width or the channel width. Therefore, the width ratio W2/W1 is a function of the power ratio k in dB according to the following equation:

$$\frac{W2}{W1} = 10^{k/20}$$

In an alternative embodiment, the first to the sixth transistors 11, 31, 51, 71, 91, 111 are implemented as bipolar transistors, the power P1 generated by the use of the first transistor 11 is related to the power P2 generated by the third transistor 51 according to the following equation:

$$\frac{P2}{P1} = 10^{k/10} = \left(\frac{I2}{I1}\right)^2 = \left(\frac{A2}{A1}\right)^2,$$

wherein A2 is the effective emitter area of the third transistor 51 and A1 is the effective emitter area of the first transistor 11. Therefore, the above and the following descriptions are also valid for bipolar transistors and can be used correspondingly by replacing the width W of a MOSFET by the effective emitter area A of a bipolar transistor.

In an embodiment, several branches of the amplifier arrangement are implemented which are to be switched on or off to control the power of the radio frequency signal SRF for each required gain setting.

In an embodiment, the several branches of the amplifier arrangement are implemented in a binary digit control configuration. By this binary digit control configuration, a simplified control scheme and chip layout can be achieved.

The number of different output power levels equals $2^N$ to control the power of the radio frequency signal SRF with binary digits of N bits in k dB steps. The optimum gate width WN which is required for each control step n can be derived from the above equation and equals:

$$Wn = W0 * 10^{\frac{k*(2^N-1-n)}{20}} \text{ for}$$
$$n = 0, 1, \ldots (2^N - 1),$$

In an embodiment, the different widths Wn of the different transistors are designed independent from each other and fulfill the above-mentioned equation.

In an alternative embodiment, the first to the sixth transistors 11, 31, 51, 71, 91, 111 are implemented as multi-finger transistors. Therefore, the width of a transistor is a multiple of the width of one finger of the multi-finger transistor. In an exemplary method to determine several values of the width of the multi-finger transistors, the following equation is used:

$$W - F(w) = 0,$$

wherein W is a constant vector which represents the optimum gate width for dB-linear characteristic and F(w) is a function which returns a vector. F(w) is the approximate function for the optimum gate width vector W. The widths Wn are the components of the vector W.

In an exemplary embodiment, a −10 dB low-power mode for a power of the transmitted signal SRF is requested. Therefore, the number of control bits of N equals 1. The value k equals −10 dB.

FIG. 3A shows a table for the width WB of the first and the second transistors 11, 31 and the width W0 of the third and the fourth transistors 51, 71. The width according to FIG. 3A is normalized in such a way that the sum of the widths equals 1. All four branches 10, 30, 50, 70 have to be switched on to achieve a maximum power of the radio frequency signal SRF. The first and the second branch 10, 30 are switched on in case of the −10 dB low power mode. If only the third and the fourth branch 50, 70 are switched on, a −3.3 dB decreased output power of the radio frequency signal SRF is available.

FIG. 3B shows an embodiment of a power control characteristic and width requirements for binary digit output power control. In this case, the optimum gate width equals the approximate gate width. The desired gain equals the gain realized with the selected width.

FIGS. 4A to 4C show exemplary tables comprising a width of transistors of an amplifier arrangement for eight gain levels. The power of the radio frequency signal SRF is controlled by using N=3 bits. Therefore, the amplifier arrangement comprises eight branches. The power ratio k equals −1 dB gain steps. Therefore, the gain control range comprises 7 dB.

FIG. 4A shows a table of an embodiment with the widths of four different transistors using the binary digit approximation. The widths are normalized so that the sum of the widths equals 1.

FIG. 4B comprises the values of the specified gain in dB and of the specified optimum width of the transistors as well as the values of the approximate gain and of the approximate width of the transistors according to an embodiment. Because of the realization of the transistors 11, 31, 51, 71, 91, 111 and so on in the form of multi-finger transistors, the approximate width of the transistors slightly differs from the specified gate width and, therefore, the approximate gain also differs from the specified gain.

FIG. 4C shows a comparison of the specified gain and the approximate gain as a function of the different power control values. The values of the specified gain are on a straight line, while the approximate gain values are higher than the specified gain values in most cases.

Figures 5A, 5B, 5C:
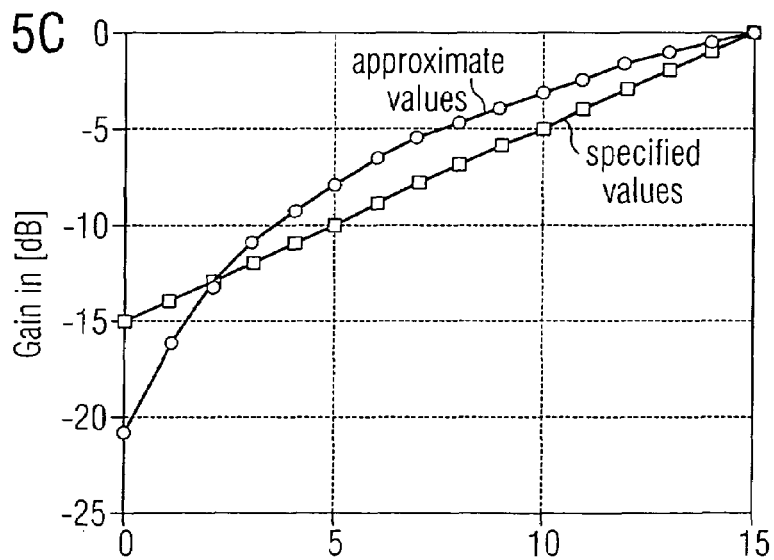
FIGS. 5A to 5C are exemplary tables illustrating a width of transistors of an amplifier arrangement for sixteen gain levels, and a graph associated therewith.

FIGS. 5A to 5C show exemplary tables comprising a width of transistors of an amplifier arrangement for sixteen gain levels.

FIG. 5A shows a table of an embodiment of the widths of the five transistors for the binary digit approximation.

The widths are normalized according to the table in FIG. 5A. The power of the radio frequency signal SRF is controlled with N=4 bits. The power ratio k equals −1 dB. Therefore, a gain control range of 15 dB is specified. The amplifier arrangement comprises ten branches.

FIG. 5B shows a table of an embodiment with 16 different power control levels starting with a specified gain of −15 dB and ending with a specified gain of 0 dB. This results in a specified normalized width ranging from 0.1778 to 1.0000.

FIG. 5C shows an embodiment of the specified gain and the approximate gain as a function of the 16 different power control levels. FIG. 5C exhibits a difference between the specified gain values and the approximate gain values.

In an alternative embodiment, sub-ranging techniques could be implemented which use different sizes of the width WB of the base amplifier. It is an advantage of this alternative embodiment that the accuracy of approximation is increased.

Figure 6A:
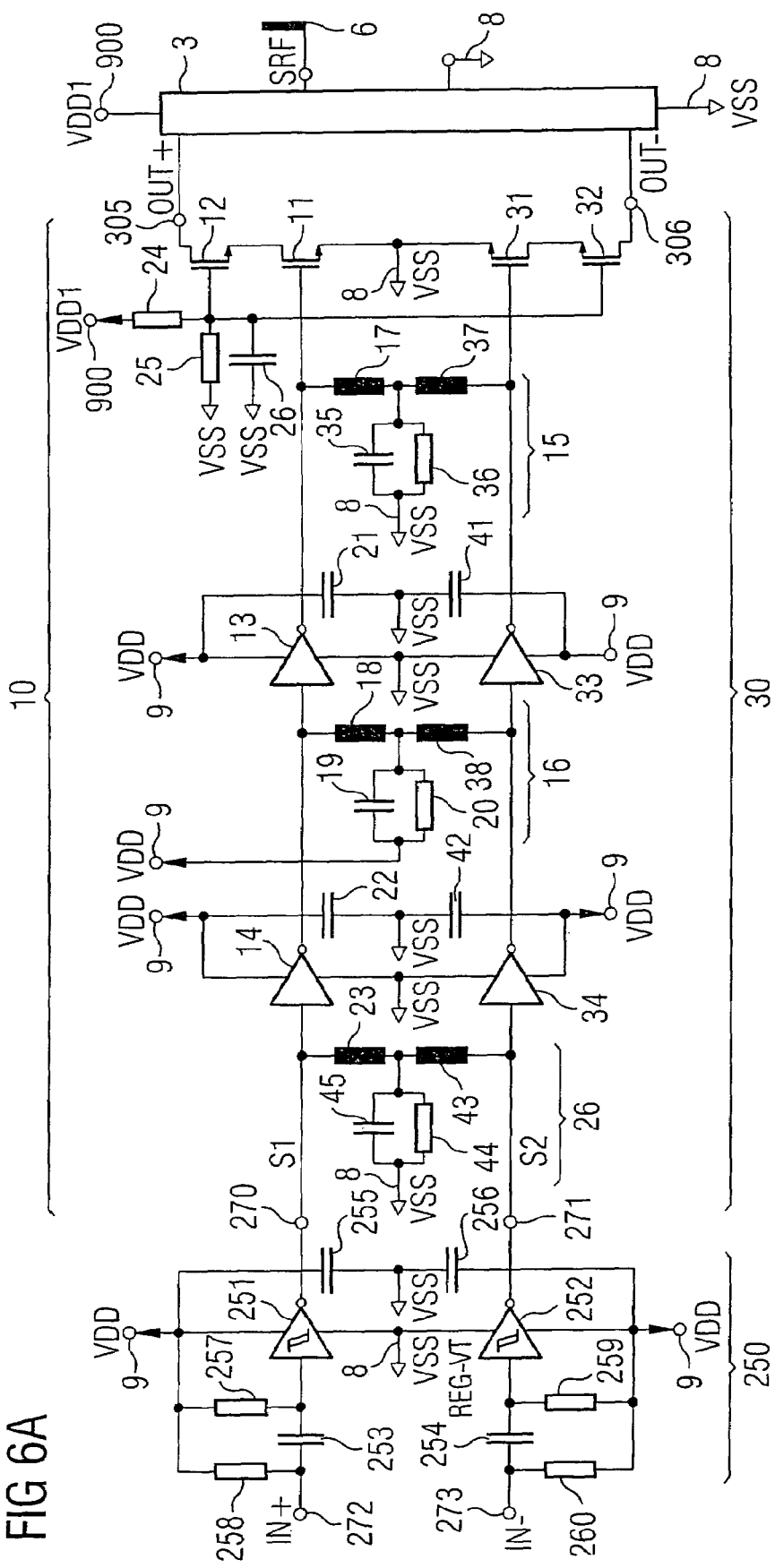

FIG. 6A shows an exemplary embodiment of an amplifier arrangement comprising two branches. FIG. 6B shows an embodiment of measurement results obtained by using the amplifier arrangement of FIG. 6A.

FIG. 6A shows an amplifier arrangement which is a further development of the first and the second branch 10, 30 of the amplifier arrangement shown in FIG. 2. The amplifier arrangement comprises a further control logic 250 which can be replaced by the control logic 2 shown in FIG. 2, the first and the second branches 10, 30 and the current combiner 3.

In accordance with the first branch 10 shown in FIG. 2, the first branch 10 comprises the first transistor 11, the cascode transistor 12, the first converter 13, and the further inverter 14. The second branch 30 comprises the second transistor 31, the second cascode transistor 32, the second inverter 33, and the further inverter 34. The series circuit comprising the first transistor 11 and the first cascode transistor 12 is arranged between the input terminal 305 of the current combiner 3 and the reference potential terminal 8. In a similar way, the series circuit comprising the second transistor 31 and the second cascode transistor 32 is arranged between the second input terminal 306 of the current combiner 3 and the reference-potential terminal 8.

The amplifier arrangement comprises a second supply voltage terminal 900 which is coupled to the reference-potential terminal 8 using two resistors 24, 25. A node in the series circuit of the two resistors 24, 25 is coupled to the control terminal of the first and of the second cascode transistor 12, 32. The node in the series circuit of the two resistors 24, 25 is coupled to the reference potential terminal 8 via a capacitor 26.

The first impedance 15 couples the control terminal of the first and of the second transistor 11, 31. The second impedance 16 couples the input terminals of the first inverter 13 and of the second inverter 32. The first and the second impedance 15, 16 are designed in accordance with the first and the second impedance 15, 16 shown in FIG. 2. A control terminal of the further inverter 14 is coupled to a control terminal of the further inverter 34 via a third impedance 26. The third impedance 26 comprises two coils 23, 43, a capacitor 45 and a resistor 44. A series circuit, comprising the two coils 23, 43, couples the input terminals of the two further inverters 14, 34 together. A node between the coil 23 and the coil 43 is coupled to the reference potential terminal 8 via a parallel circuit of the capacitor 45 and the resistor 44. The amplifier arrangement further comprises capacitors 21, 22, 41, 42 which couple the supply voltage terminal 9 to the reference-potential terminal 8.

The further control logic 250 comprises a first and a second Schmitt-Trigger gate 251, 252, four capacitors 253 to 256, and four resistors 257 to 260. An input terminal 272 of the further control logic 250 is coupled to an output terminal 270 of the further control logic 250 via a series circuit of the capacitor 253 and the Schmitt-Trigger gate 251. In an analogous way, an input terminal 273 of the further control logic 250 is coupled to an output terminal 271 of the further control logic 250 via the capacitor 254 and the Schmitt-Trigger gate 252. The supply voltage terminal 9 is connected to the reference-potential terminal 8 via the capacitors 255 and 256, to the input terminal 272 via the resistor 258, and to an input terminal of the Schmitt-Trigger gate 251 via the resistor 257, to the input terminal 273 via the resistor 260 and to an input terminal of the Schmitt-Trigger gate 252 via a resistor 259.

The data signal IN is provided to an input terminal 272 and a negative data signal IN− is provided to a further input terminal 273 of the further control logic 250. The Schmitt-Trigger gates 251, 252 generate digital signals S1, S2 at the output terminals 270, 271 of the further control logic 250. The Schmitt-Trigger gates 251, 252 generate the signals S1, S2 in a digital form even if the data signal IN or the negative data signal IN− are not digital signals. The Schmitt-Trigger gates 251, 252 are matched to a 50Ω system. The signal S1 is amplified by the further inverter 14, the first inverter 13 and the series circuit comprising the first transistor 11 and the first cascode transistor 12. In an analogous manner, the signal S2 is amplified by the further inverter 34, the second inverter 32 and the series circuit comprising the second transistor 31 and the second cascode transistor 32. The first, the second, and the third impedance 15, 16, 26 are used to compensate the capacitive input characteristics of the four inverters 13, 14, 33, 34 and the first and the second transistors 11, 31. The first, the second, and the third impedances 15, 16, 26 define a power-up preconditioning voltage for a zero output current of the radio frequency signal SRF. The capacitors 35, 19, 45 help to suppress common mode oscillations and provide a defined supply voltage ramp-up preconditioning for the inverter logic states.

The amplified signals are provided to the input terminals 305, 306 of the current combiner 3. A voltage at the control terminals of the first and the second cascode transistors 12, 32 can be determined by a second supply voltage VDD1 provided at the second supply voltage terminal 900 and the two resistors 24, 25. Therefore, a fine adjustment of the power of the radio frequency signal SRF at the output of the current combiner 3 can be achieved.

A chip comprising the amplifier arrangement was produced in a 0.13 μm complimentary metal oxide semiconductor integration technique. According to this exemplary embodiment shown in FIG. 6A, the amplifier arrangement operates at a frequency of 1.9 GHz and achieves a gain of 28 dBm during a test. The supply voltage is about 1.5 V.

FIG. 6B shows measurement results of the power of the radio frequency signal SRF at different values of the second supply voltage VDD1 which is supplied at the second supply voltage terminal 900. The second supply voltage VDD1 ranges from 1.5 V to 2.5 V. The power is shown as a function of the frequency of the radio frequency signal SRF.

In an alternative embodiment, the amplifier arrangement comprises further branches which are designed similar to the first and the second branch 10, 30. The values of the widths of the several transistors may be chosen according to the tables in FIGS. 3A, 3B, 4A, 4B, 5A, and 5B.

Figure 7A:
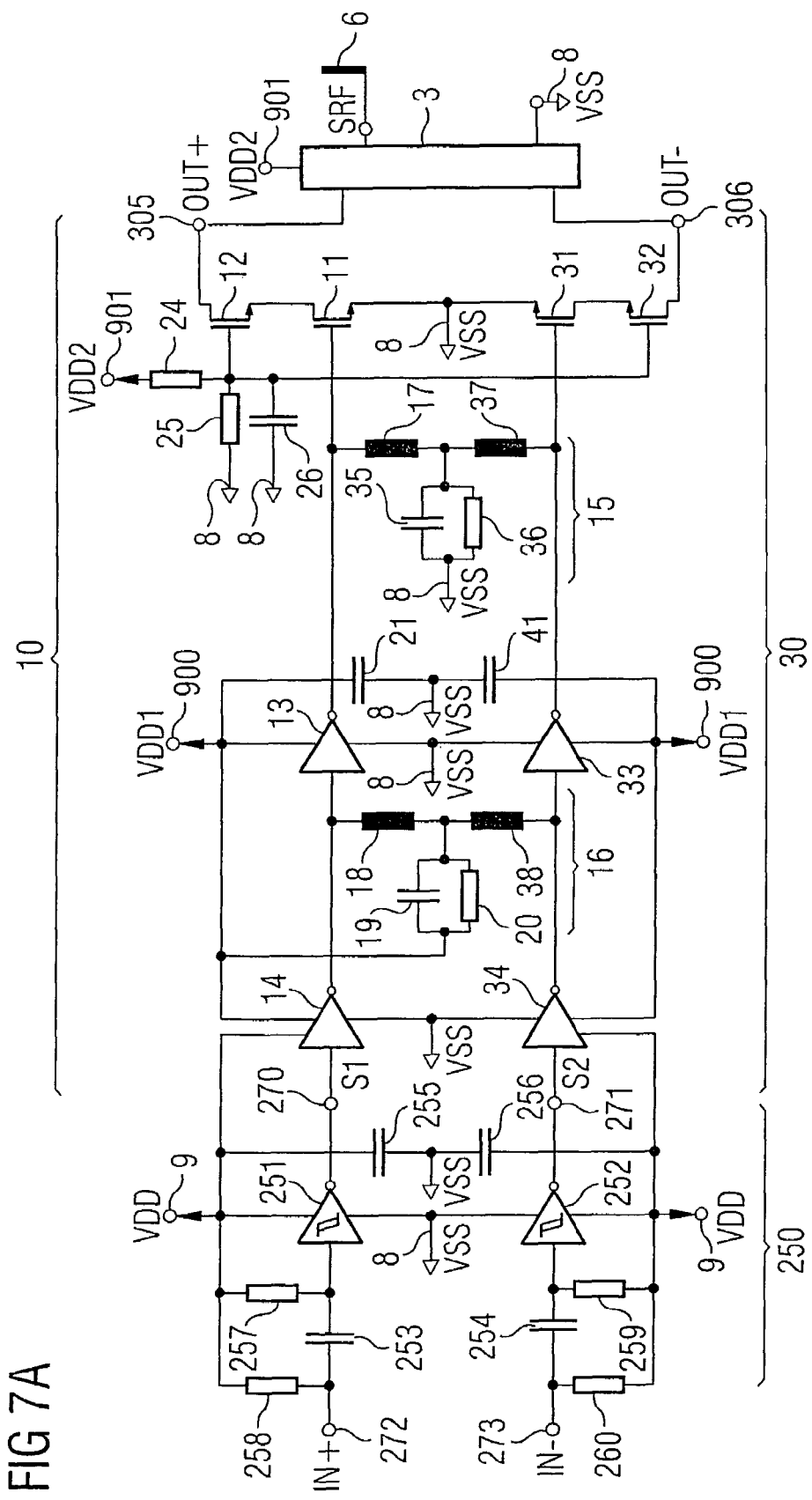

FIGS. 7A and 7B show another exemplary embodiment of an amplifier arrangement, comprising two branches and show measurement results obtained by using the amplifier arrangement.

FIG. 7A shows an amplifier arrangement according to yet another embodiment which is a further development of the first and the second branch 10, 30 of the amplifier arrangement shown in FIG. 6A. The amplifier arrangement comprises the further control logic 250, the first and the second branch 10, 30 and the current combiner 3. The amplifier arrangement comprises the first supply voltage terminal 9, the second supply voltage terminal 900 and a third supply voltage terminal 901. The supply voltage VDD is supplied at the supply voltage terminal 9, the second supply voltage VDD1 is supplied at the second supply voltage terminal 900, and the third supply voltage VDD3 is supplied at the third supply voltage terminal 901. The further control logic 250 is coupled to the supply voltage terminal 9 and operates with the supply voltage VDD. The further inverter 14 of the first branch 10 and the further inverter 34 of the second branch 30 are coupled to the supply voltage terminal 9 and the second supply voltage terminal 900 and, therefore, use the supply voltage VDD and the second supply voltage VDD1 for operation. The first and the second inverter 13, 33 are coupled to the second supply voltage terminal 900 and are operated using the second supply voltage VDD1. The series circuit comprising the resistors 24, 25 is coupled between the third supply voltage terminal 901 and the reference-potential terminal 8. Therefore, the voltage which is provided to the control terminals of the first and the second cascode transistors 12, 32 is generated by the use of the third supply voltage VDD2.

Therefore, the further inverters 14, 34 operate as level shifter between the further control logic 250 and the further parts of the first and the second branch 10, 30.

In an embodiment, the first and the second inverter 13, 33 and the current combiner 3 are directly connected to a battery. A control logic 2 or a further control logic 250 can be operated by the supply voltage which has a lower value than the second and the third supply voltage.

In an embodiment, the amplifier arrangement shown in FIG. 7A was tested at the frequency of the signals S1, S2 of 900 MHz. The specified gain was 36 dBm.

FIG. 7B shows measurement results of the power of the radio frequency signal SRF as a function of the frequency f of the signals S1, S2 and the radio frequency signal SRF. FIG. 7B shows the power with different values for the first supply voltage VDD2.

In an alternative embodiment, the amplifier arrangement according to FIG. 7A comprises further branches.

Figure 8A:
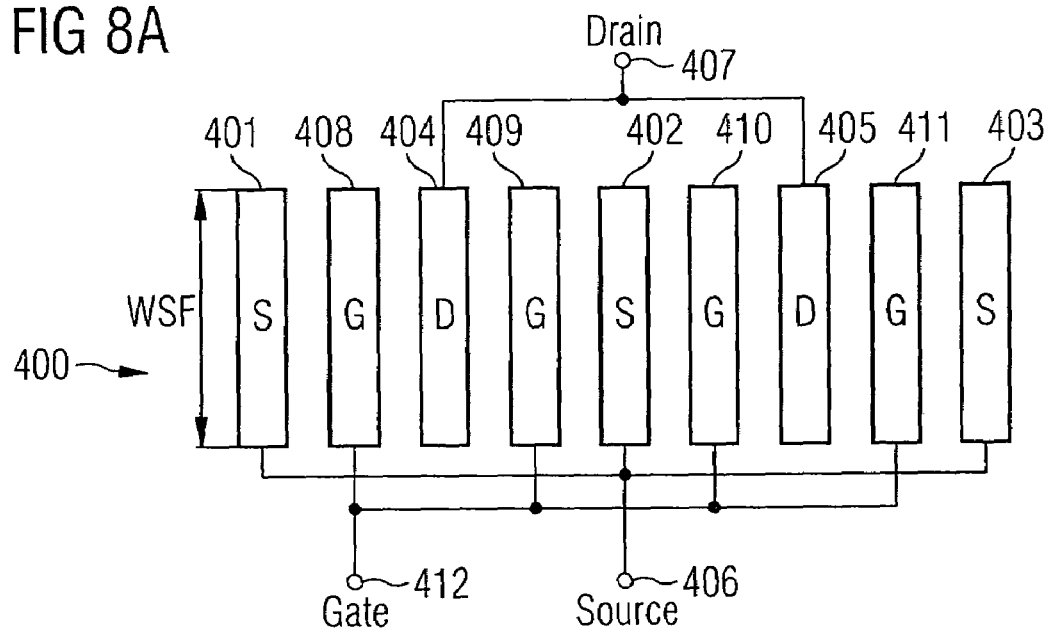

FIG. 8A shows a multi-finger transistor 400 which can be used for the implementation of the first to sixth transistors 11, 31, 51, 71, 91, 111 shown in the FIGS. 1A to 1C and of the transistors shown in FIGS. 2, 6A, and 7A. The multi-finger transistor 400 can also be used for implementation of the values of the approximate width in the tables of FIGS. 3B, 4B, and 5B. The multi-finger transistor 400 shown in FIG. 8A is implemented as a MOSFET. It comprises three source areas 401, 402, 403 and two drain areas 404, 405 which are arranged in parallel. The three source areas 401 to 403 are coupled to a first terminal 406 of the multi-finger transistor 400 and the two drain areas 404, 405 are coupled to a second terminal 407 of the multi-finger transistor 400. Four gate electrodes 408 to 411 are arranged between the source and the drain areas and are coupled to the control terminal 412 of the multi-finger transistor 400. The width of the source areas and of the drain areas has the value WSF. FIG. 8A shows a multi-finger transistor 400 with a width of 4 WSF.

In an alternative embodiment, an additional drain area is added to the multi-finger transistor 400 shown in FIG. 8A. Therefore, the width of the alternative multi-finger transistor has the value 5 WSF.

In an alternative embodiment, the multi-finger transistor 400 comprises one source area 401 and one drain area 404 and, therefore, shows a width with the value WSF.

According to an embodiment, the width of a transistor is a multiple of the value WSF. Therefore, the values of the approximate width in the tables of FIGS. 3B, 4B, and 5B differ from the values of the specified width in these three tables.

Figure 8B:
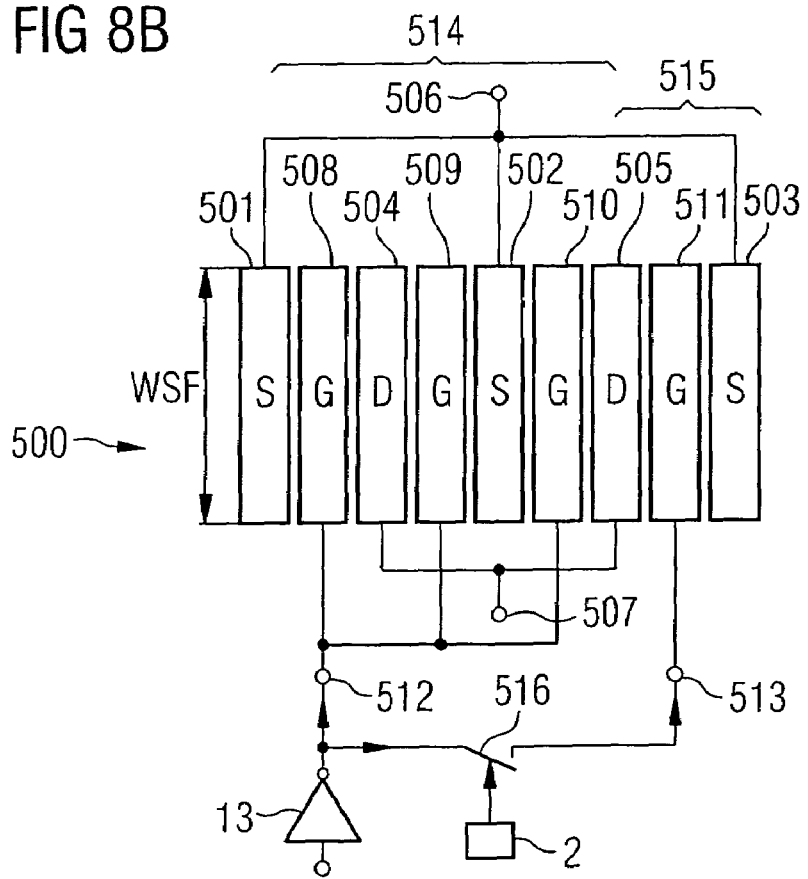

FIG. 8B shows another example for a multi-finger transistor 500 which can be used for the implementation of the transistors shown in FIGS. 6A, and 7A and for implementation of the values of the approximate width in the tables of FIGS. 3B, 4B, and 5B.

The multi-finger transistor 500 comprises three source areas 501, 502, 503 and two drain areas 504, 505 which extend in a main direction and are arranged in parallel. The three source areas 501 to 503 are coupled to a first terminal 506 of the multi-finger transistor 500 and the two drain areas 504, 505 are coupled to a second terminal 507 of the multi-finger transistor 500. Four gate electrodes 508 to 511 are arranged between the source and the drain areas. Three gate electrodes 508 to 510 of the four gate electrodes 508 to 511 are coupled to the control terminal 512 of the multi-finger transistor 500 and the gate electrode 511 is coupled to a further control terminal 513 of the multi-finger transistor 500. FIG. 8B shows a multi-finger transistor 500 comprising a transistor 514 with a width of 3 WSF and a further transistor 515 with a width of 1 WSF.

The control terminal 512 is coupled to the first inverter 13. The further control terminal 513 is coupled to the first inverter 13 via a switch 516. The state of the switch 516 is controlled by the control logic 2. By closing the switch 516, the current flowing through the multi-finger transistor 500 and the power of the radio frequency signal SRF are increased.

In an alternative embodiment, the multi-finger transistor 500 comprises more than two control terminals and is divided in more than two transistors.

Figure 8C:
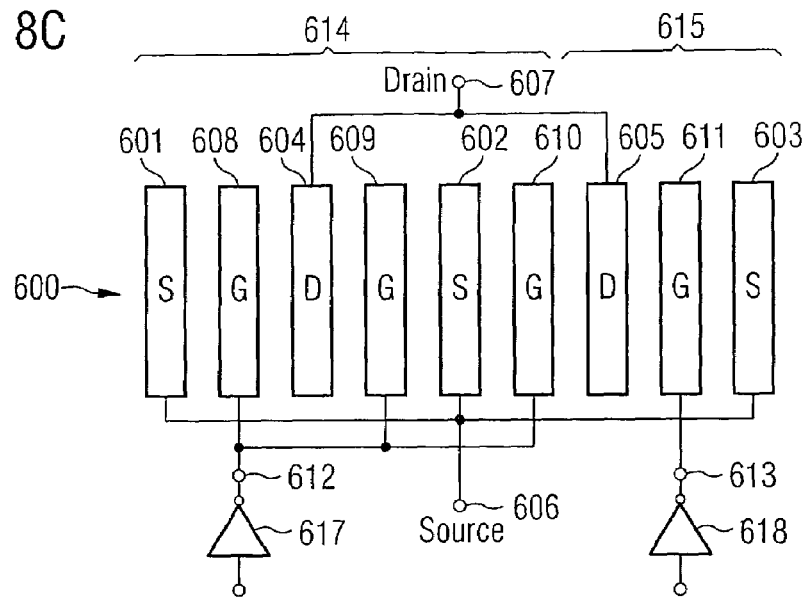

FIG. 8C shows an exemplary embodiment of a multi-finger transistor 600 which can be used for the implementation of the transistors shown in FIGS. 1A to 1C and 2, and for implementation of the values of the approximate width in the tables of FIGS. 3B, 4B, and 5B.

The multi-finger transistor 600 comprises three source areas 601 to 603 and two drain areas 604, 605 which extend in a main direction and are arranged parallel. The three source areas 601 to 603 are coupled to the first terminal 606 of the multi-finger transistor 600 and the two drain areas 604, 606 are coupled to the second terminal 607 of the multi-finger transistor 600. Four gate electrodes 608 to 611 are arranged between the source and the drain areas. Three gate electrodes 608 to 610 of the four gate electrodes 608 to 611 are coupled to the control terminal 612 of the multi-finger transistor 600. The gate electrode 611 is coupled to the further control terminal 613 of the multi-finger transistor 600. FIG. 8C, therefore, shows an embodiment of a multi-finger transistor 600 comprising the first transistor 614 with a width of 3 WSF and the second transistor 615 with a width of one WSF.

An output terminal of an inverter 617 is coupled to the control terminal 612 and an output terminal of a further inverter 618 is coupled to the further control terminal 613.

In an embodiment, the multi-finger transistor 600 is inserted as the first transistor 11 and the third transistor 51 in the amplifier arrangement according to FIG. 1A. The inverter 617 corresponds to the first inverter 13 and the further inverter 618 corresponds to the third inverter 53, shown in FIG. 1A.

In an alternative embodiment, the multi-finger transistor 600 comprises further drain and source areas and gate electrodes so that the multi-finger transistor 600 also comprises the fifth transistor 91 shown in FIG. 1A.

Figure 8D:
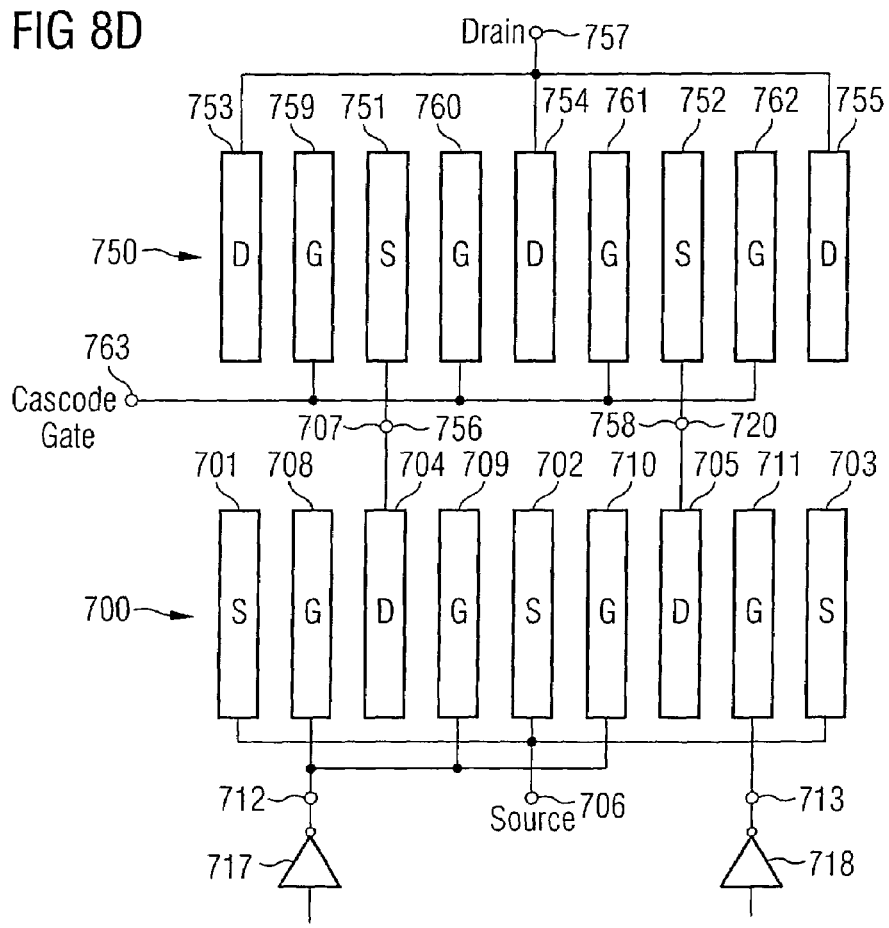

FIG. 8D shows an exemplary embodiment of a multi-finger transistor 700 and a cascode transistor 750. The cascode transistor 750 is also implemented in the form of a multi-finger transistor. The multi-finger transistor 700 and the cascode transistor 750 can be used for implementation of the transistors and the cascode transistors shown in FIGS. 2, 6A, and 7A and for implementation of the values of the approximate width in the tables of FIGS. 3B, 4B and 5B, for example.

The multi-finger transistor 700 corresponds to the multi-finger transistor 600 shown in FIG. 8C besides that the multi-finger transistor 700 comprises a third terminal 720. The drain area 704 is coupled to the second terminal 707 and the drain area 705 is coupled to the third terminal 720.

The cascode transistor 750 comprises two source areas 751, 752 and three drain areas 753, 754, 755. The source area 751 is coupled to a first terminal 756 of the cascode transistor 750 and the source area 752 is coupled to a third terminal 758 of the cascode transistor 750.

The three drain areas 753 to 755 are coupled to a second terminal 757 of the cascode transistor 750. Four gate electrodes 759 to 762 are arranged between the source and the drain areas and are coupled to a control terminal 763 of the cascode transistor 750. Therefore, the source area 751 of the cascode transistor 750 is coupled to the drain area 704 of the multi-finger transistor 700. In a similar way the source area 752 of the cascode transistor 750 is coupled to the drain area 705 of the multi-finger transistor 700.

Figure 8E:
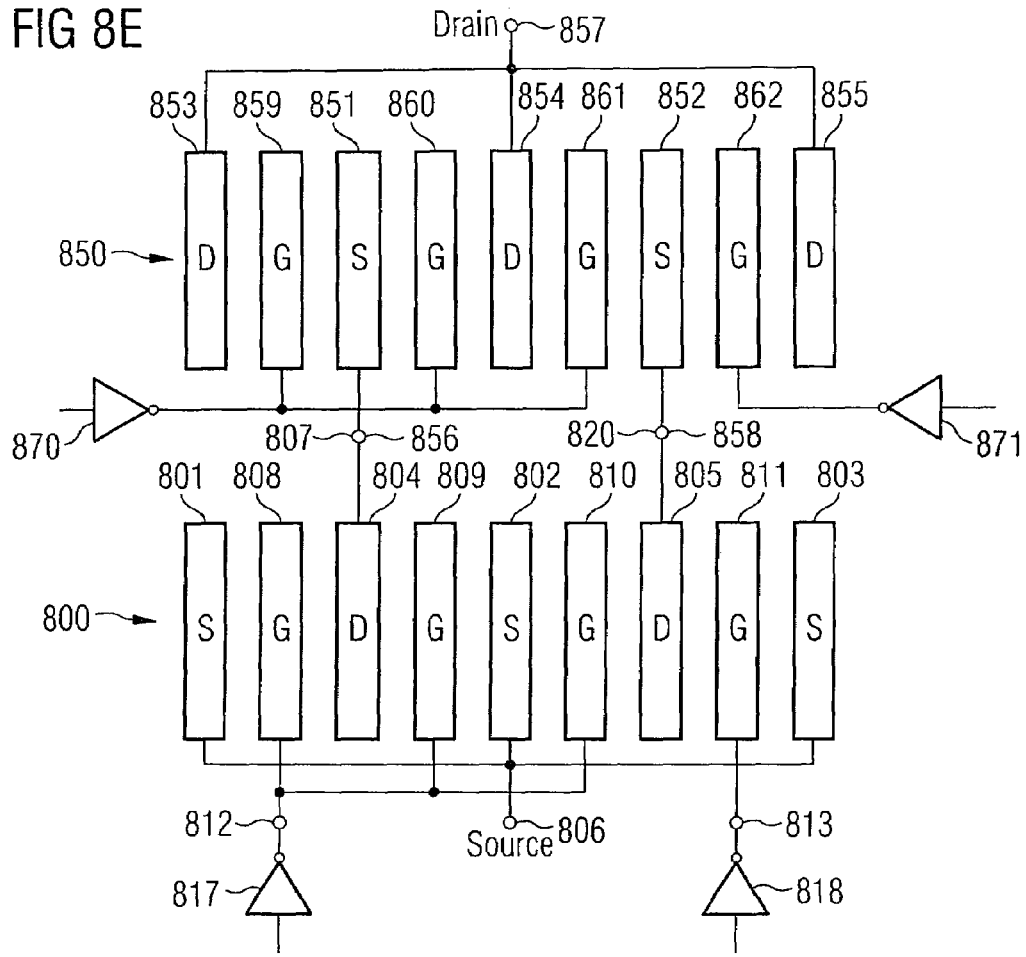

FIG. 8E shows another exemplary embodiment of a multi-finger transistor 800 and a cascode transistor 850 which is a further development of the transistors shown in FIG. 8D. The multi-finger transistor 800 and the cascode transistor 850 can be used for implementation of the transistors and the cascode transistors shown in the FIGS. 2, 6A, and 7A and for implementation of the values of the approximate width in the tables of FIGS. 3B, 4B and 5B. The multi-finger transistor 800 corresponds to the multi-finger transistor 700 shown in FIG. 8D. The cascode transistor 850 corresponds to the cascode transistor 750 shown in FIG. 8D besides the features that the four gate areas 859 to 862 are not connected together. Three gate areas 859 to 861 are coupled to an inverter 870 and one gate area 862 is coupled to a further inverter 871.

In an embodiment, the second terminal 857 of the cascode transistor 850 is coupled to the current combiner 3 which is not shown in FIG. 8E. The input terminals of the two inverters 870, 871 are coupled to the control logic 2 which is not shown in FIG. 8E. As a result of this coupling the power generated at the output of the current combiner 3 can be further controlled by signals which are provided by the control logic 2 to the two inverters 870, 871.

Figure 8F:
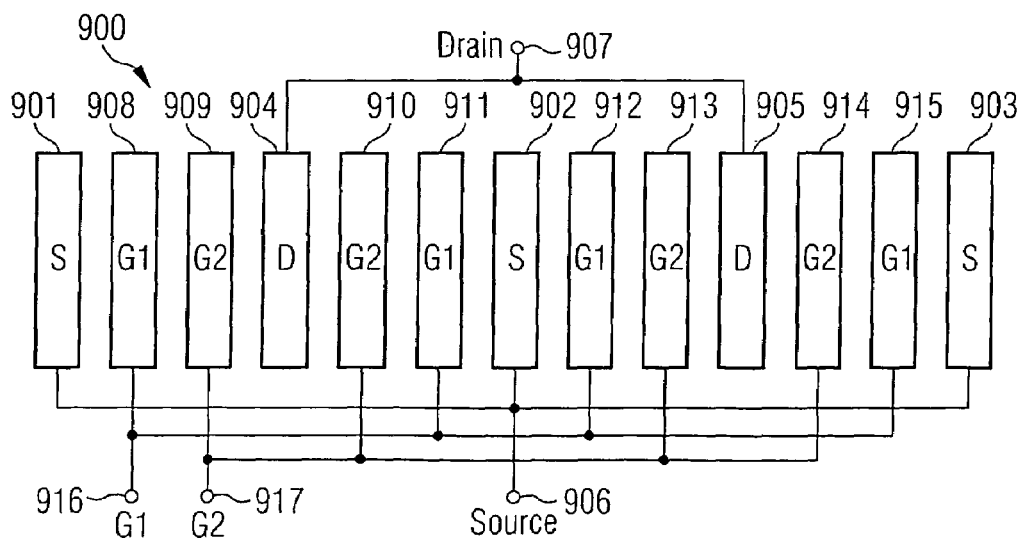

FIG. 8F shows another exemplary embodiment of a multi-finger transistor 900 which can be used for implementation of the transistors shown in the figures before. The multi-finger transistor 900 comprises three source areas 901 to 903 and two drain areas 904, 905 which extend in a main direction and are arranged in parallel. The three source areas 901 to 903 are coupled to a first terminal 906 of the multi-finger transistor 900 and the two drain areas 904, 905 are coupled to a second terminal 907 of the multi-finger transistor 900. In FIG. 8F an embodiment of a multi-finger dual-gate MOSFET is shown. Therefore, two gate electrodes 908, 909 are arranged between the source areas 901 and the drain area 904. Two further gate electrodes 910, 911 are arranged between the drain area 904 and the source area 902. Further gate electrodes 912, 913 and additional gate electrodes 914, 915 are arranged between the further drain and source areas. Four gate electrodes 908, 911, 912, 915 are coupled to a first control terminal 916. The other four gate electrodes 909, 910, 913, 914 are coupled to a second control terminal 917.

The multi-finger dual-gate MOSFET 900 can, for example, be used as the first transistor 11 in FIG. 1. In one embodiment, the first control terminal 916 can be coupled to the output terminal of the first inverter 13. The second control terminal 917 can be coupled to a further output terminal of the control logic 2. By the use of a signal provided to the second control terminal 917 the power which is provided by the transistor 900 and, therefore, the power provided by the radio frequency signal SRF can be adjusted.

FIG. 8G shows another exemplary embodiment of a multi-finger transistor 950 which is a dual-gate transistor and can be used in FIGS. 1A to 1C and FIG. 2. The multi-finger transistor 950 can be inserted, for example, as the first transistor 11 and the third transistor 51. The transistor 950 comprises three source areas 951 to 953 and two drain areas 954, 955. The three source areas 951 to 953 are coupled to a first terminal 956 of the multi-finger transistor 950 and the two drain areas 954, 955 are coupled to a second terminal 957 of the multi-finger transistor 950. Eight gate electrodes 958 to 965 are arranged between the source and the drain areas. A pair of two gate electrodes is located between a source and a drain area. The gate electrodes 958, 961, 962 are coupled to a first control terminal 970. The gate electrodes 959, 960, 963 are coupled to a second control terminal 971. The gate electrode 964 is coupled to a third control terminal 972 and gate electrode 965 is coupled to a fourth control terminal 973. The first control terminal 970 corresponds to a control terminal of the first transistor 11, while the third control terminal 972 corresponds to the control terminal of the third transistor 51. Four inverters 974 to 977 are shown in FIG. 8G.

In an embodiment, the first inverter 974 corresponds to the first inverter 13 in FIG. 1A while the third inverter 976 corresponds to the third inverter 53 in FIG. 1A. The second control terminal 971 is coupled to an output terminal of the logic circuit 2 which is not shown in FIG. 8G via the second inverter 975. Also the fourth control terminal 973 is coupled to an output terminal of the control logic 2 via the fourth inverter 977. Using the control terminals 971, 973 the output power provided by the transistor 950 can be further adjusted.

The transistors shown in FIGS. 8F and 8G can be used to implement switching-mode circuit functions such as switching-mode amplifiers, power digital analogue converters and switching-mode mixers.

In an alternative embodiment, the size of each finger can be designed to be different.

In another alternative embodiment, dummy fingers are arranged at the border of the transistor structure.

In yet another alternative embodiment, the transistors shown in FIGS. 8A to 8G can be implemented as bipolar transistors.

In one embodiment of the invention, an amplifier arrangement comprises a control logic, a first branch, a second branch and a current combiner. The first branch comprises a first transistor comprising a control terminal, which is coupled to the control logic to provide a first signal to the control terminal, a first terminal, which is coupled to a reference potential terminal, and a second terminal and a first cascode transistor comprising a control terminal, a first terminal, which is coupled to the second terminal of the first transistor, and a second terminal. The second branch comprises a second transistor comprising a control terminal, which is coupled to the control logic to provide a second signal to the control terminal, a first terminal, which is coupled to the reference potential terminal, and a second terminal, and a second cascode transistor comprising a control terminal, a first terminal, which is coupled to the second terminal of the second transistor, and a second terminal. The current combiner couples the second terminal of the first cascode transistor and the second terminal of the second cascode transistor to an output terminal of the amplifier arrangement and to a power supply terminal.

In another embodiment of the invention, an amplifier arrangement comprises a control logic, a first branch, a second branch and a current combiner. The first branch comprises a first multi-finger transistor comprising a first control terminal and a further control terminal, which are coupled to the control logic to provide a first signal to the first control terminal and a further signal to the further control terminal, a first terminal, which is coupled to a reference potential terminal, and a second terminal. The second branch comprises a second multi-finger transistor comprising a first control terminal and a further control terminal, which are coupled to the control logic to provide a second signal to the first control terminal and a further signal to the further control terminal, a first terminal, which is coupled to the reference potential terminal, and a second terminal. The current combiner couples the second terminal of the first multi-finger transistor and the second terminal of the second multi-finger transistor to an output terminal of the amplifier arrangement and to a power supply terminal.

In an further embodiment of the invention, a power amplifier comprises a control signal generator providing a first and a second signal, a first amplifier comprising a first transistor and a first cascode transistor for amplification of the first signal, a second amplifier comprising a second transistor and a second cascode transistor for amplification of the second signal, an output coupler which couples an output of the first amplifier and an output of the second amplifier to an output terminal of the amplifier arrangement.

In an embodiment of the invention, a method for amplifying a signal comprises feeding a first signal to a first branch of an amplifier arrangement; feeding a second signal to a second branch of the amplifier arrangement; amplifying the first signal by a first transistor and a first cascode transistor of the first branch and providing a first output signal; amplifying the second signal by a second transistor and a second cascode transistor of the second branch and providing a second output signal; combining the first output signal and the second output signal.

In another embodiment of the invention, a method for amplifying a signal comprises feeding a first signal to a first branch of an amplifier arrangement; feeding a second signal to a second branch of an amplifier arrangement; amplifying the first signal by a first multi-finger transistor comprised by the first branch and providing a first output signal; amplifying the second signal by a second multi-finger transistor comprised by the second branch and providing a second output signal; combining the first output signal and the second output signal.

In an additional embodiment of the invention, a method for designing an amplifier arrangement comprises calculating a width Wn according to the equation $$Wn = W0 * 10^{\frac{k*(2^N-1-n)}{20}} \text{ for}$$
$$n = 0, 1, \ldots (2^N - 1),$$

wherein Wn is the width of a transistor of a branch, W0 is a width of a basis transistor, N is the number of bits of the binary digits of an output level in dB and k are the dB steps.

In an embodiment, the first signal, the second signal, and the further signals are provided as digital signals by the control logic.

In a further embodiment, the second signal differs from the first signal. In an embodiment, the fourth signal differs from the third signal.

In an embodiment, the phase difference of the first and the second signal equals approximately 180 degrees and also the phase difference of the third and the fourth signal equals approximately 180 degrees.

In an embodiment, the first and the second transistor have the same value of the width-to-length ratio W/L. The third and the fourth transistor can also have the same value for the width-to-length ratio W/L. In a further embodiment, the width-to-length ratio W/L of the first and the second transistor differs from the width-to-length ratio W/L of the third and the fourth transistor.

In an embodiment, the lengths L of the first to the fourth and of the further transistors are approximately equal and the width of the first and of the second transistors differs from the width of the third and of the fourth transistors.

In an embodiment, an output terminal of the control logic is directly coupled to the control terminal of the first transistor of the first branch and corresponding output terminals are directly coupled to the control terminals of the corresponding transistors of the further branches. In an alternative embodiment, the output terminal of the control logic is coupled to the control terminal of the first transistor of the first branch via a first inverter. In a second alternative embodiment, the output terminal of the control logic is coupled to the control terminal of the first transistor of the first branch via two or more inverters. The further branches can by designed in an analogous manner.

In an embodiment, the signals which are provided to the control terminals of the cascode transistors of each branch are constant during a first mode of operation. In a further development, the power of a radio frequency signal provided at the output terminal of the current combiner is adjusted by the value of the signals provided to the control terminals of the cascode transistors.

In an alternative embodiment, the control terminals of the cascode transistors of each branch are coupled to further output terminals of the logic circuit. Therefore, the control logic is designed to adjust the power of the radio frequency signal in a second mode of operation.

In an embodiment, the current combiner comprises a balun. Therefore, two signals which are provided in a differential way to the current combiner can be converted in a single-ended signal. The single-ended signal can be provided to an antenna.

In an embodiment, the first to the fourth transistor of the first to the fourth branch comprise multi-finger transistors. In an embodiment, the multi-finger transistors comprise a first and a second terminal and at least two control terminals. The at least two control terminals of the multi-finger transistors are coupled to output terminals of the control logic. Therefore, different signals can be provided to the different control terminals of the multi-finger transistors. It is an advantage of this embodiment that the current flowing through a multi-finger transistor with two or more control terminals can be adjusted by the signal provided to the two or more control terminals.

In an embodiment, a signal is provided to the first control terminal of the multi-finger transistor and the signal is also provided to the second control terminal of the multi-finger transistor, depending on the state of a switch. In an embodiment, the switch may be arranged between the first control terminal of a multi-finger transistor and the second control terminal of the multi-finger transistor.

Although specific embodiments have been illustrated and described herein, it will be appreciated by those of ordinary skill in the art, that any arrangement which is calculated to achieve the same purpose may be substituted of the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. 1.72(b) requiring an abstract that will allow the reader to quickly ascertain the nature and gist of the technical disclosure. It is submitted with the understanding, that it will not be used to interpret or limit the scope or meaning of the claims.

What is claimed is:

1. An amplifier arrangement, comprising:
a control logic circuit;
a first branch, comprising:
a first transistor comprising a control terminal coupled to the control logic circuit, and configured to receive a first signal at the control terminal, and comprising a first terminal coupled to a reference-potential terminal, and a second terminal; and a first cascode transistor comprising a control terminal, a first terminal coupled to the second terminal of the first transistor, and a second terminal;

a second branch, comprising:
a second transistor comprising a control terminal coupled to the control logic circuit, and configured to receive a second signal at the control terminal, and comprising a first terminal coupled to the reference-potential terminal, and a second terminal; and
a second cascode transistor comprising a control terminal, a first terminal coupled to the second terminal of the second transistor, and a second terminal; and a current combiner coupled to the second terminal of the first cascode transistor and the second terminal of the second cascode transistor, and configured to combine the currents associated with the first and second cascode transistors, and provide the combined current at an output terminal of the amplifier arrangement, wherein the control logic circuit is configured to provide the first and the second signal as digital signals, and wherein the second signal has a phase difference of approximately 180 degrees with respect to the first signal.

2. An amplifier arrangement, comprising:
a control logic circuit;
a first branch, comprising:
a first transistor comprising a control terminal coupled to the control logic circuit, and configured to receive a first signal at the control terminal, and comprising a first terminal coupled to a reference-potential terminal, and a second terminal; and
a first cascode transistor comprising a control terminal, a first terminal coupled to the second terminal of the first transistor, and a second terminal;
a second branch, comprising:
a second transistor comprising a control terminal coupled to the control logic circuit, and configured to receive a second signal at the control terminal, and comprising a first terminal coupled to the reference-potential terminal, and a second terminal; and
a second cascode transistor comprising a control terminal, a first terminal coupled to the second terminal of the second transistor, and a second terminal; and
a third branch, comprising:
a third transistor comprising a control terminal coupled to the control logic circuit, and configured to receive a third signal at the control terminal, and comprising a first terminal coupled to the reference-potential terminal, and a second terminal; and
a third cascode transistor comprising a control terminal, a first terminal coupled to the second terminal of the third transistor, and a second terminal;
a fourth branch, comprising:
a fourth transistor comprising a control terminal coupled to the control logic circuit, and configured to receive a fourth signal at the control terminal, and comprising a first terminal coupled to the reference potential terminal, and a second terminal; and
a fourth cascode transistor comprising a control terminal, a first terminal coupled to the second terminal of the fourth transistor, and a second terminal;
a current combiner coupled to the second terminal of the first cascode transistor, the second terminal of the second cascode transistor, the second terminal of the third cascode transistor and the second terminal of the fourth cascode transistor, and wherein the current combiner is configured to combine the currents associated with the first, second, third and fourth cascode transistors, and provide the combined current at the output terminal of the amplifier arrangement, wherein the third transistor and the fourth transistor have a different gate width to gate length ratio W/L with respect to the first transistor and the second transistor.

3. An amplifier arrangement, comprising:
a control logic circuit;
a first branch, comprising:
a first transistor comprising a control terminal coupled to the control logic circuit, and configured to receive a first signal at the control terminal, and comprising a first terminal coupled to a reference-potential terminal, and a second terminal; and
a first cascode transistor comprising a control terminal, a first terminal coupled to the second terminal of the first transistor, and a second terminal;
a second branch, comprising:
a second transistor comprising a control terminal coupled to the control logic circuit, and configured to receive a second signal at the control terminal, and comprising a first terminal coupled to the reference-potential terminal, and a second terminal; and
a second cascode transistor comprising a control terminal, a first terminal coupled to the second terminal of the second transistor, and a second terminal; and
a current combiner coupled to the second terminal of the first cascode transistor and the second terminal of the second cascode transistor, and configured to combine the currents associated with the first and second cascode transistors, and provide the combined current at an output terminal of the amplifier arrangement,
wherein a width Wn of the first and second transistors satisfies the equation $$Wn = W0 * 10^{\frac{k*(2^N-1-n)}{20}} \text{ for}$$
$$n = 0, 1, \ldots (2^N - 1),$$

wherein Wn is the width of a transistor of an $n^{th}$ branch, W0 is a width of a basis transistor, N is the number of bits of the binary digits of an output level in dB and k are the gain steps in dB.

4. The amplifier arrangement of claim 3, wherein a width Wna satisfies the equation $$W-F(w)=0,$$

wherein Wna is an approximate width of the transistor of a branch, W is a constant vector comprising the values Wn of the width of the transistors as components of W, and F(w) is a function which returns a vector.

5. The amplifier arrangement of claim 4, wherein the third signal has a phase difference of approximately 90 degrees with respect to the first signal, and wherein the fourth signal has a phase difference of approximately 270 degrees with respect to the first signal.

6. The amplifier arrangement of claim 1, further comprising:
a first inverter coupled between a first output terminal of the control logic circuit and the control terminal of the first transistor, and
a second inverter coupled between a second output terminal of the control logic circuit and the control terminal of the second transistor.

7. The amplifier arrangement of claim 1, wherein the signals provided to the control terminals of the cascode transistors of each branch are substantially constant during a first mode of operation.

8. The amplifier arrangement of claim 1, wherein the control terminals of the cascode transistors of each branch are coupled to an adjustable supply voltage.

9. The amplifier arrangement of claim 1, wherein the current combiner comprises a balun.

10. An amplifier arrangement, comprising:
a control logic circuit;
a first branch, comprising:
a first multi-finger transistor comprising a first control terminal and a further control terminal, which are coupled to the control logic circuit, and configured to receive a first signal to the first control terminal and a further signal to the further control terminal, a first terminal coupled to a reference potential terminal, and a second terminal;
a second branch, comprising:
a second multi-finger transistor comprising a first control terminal and a further control terminal, which are coupled to the control logic circuit, and configured to receive a second signal to the first control terminal and a further signal to the further control terminal, a first terminal coupled to the reference potential terminal, and a second terminal; and
a current combiner coupled to the second terminal of the first multi-finger transistor and the second terminal of the second multi-finger transistor, and configured to combine the currents associated with the first and second multi-fingered transistors, and provide the combined current to an output terminal of the amplifier arrangement,
wherein the control logic circuit is configured to provide the first signal, the second signal, and the further signals as digital signals, and wherein the second signal has a phase difference of approximately 180 degrees with respect to the first signal.

11. An amplifier arrangement, comprising:
a control logic circuit;
a first branch, comprising:
a first multi-finger transistor comprising a first control terminal and a further control terminal, which are coupled to the control logic circuit, and configured to receive a first signal to the first control terminal and a further signal to the further control terminal, a first terminal coupled to a reference potential terminal, and a second terminal;
a second branch, comprising:
a second multi-finger transistor comprising a first control terminal and a further control terminal, which are coupled to the control logic circuit, and configured to receive a second signal to the first control terminal and a further signal to the further control terminal, a first terminal coupled to the reference potential terminal, and a second terminal; and
a current combiner coupled to the second terminal of the first multi-finger transistor and the second terminal of the second multi-finger transistor, and configured to combine the currents associated with the first and second multi-fingered transistors, and provide the combined current to an output terminal of the amplifier arrangement,
wherein a width Wn of the first and second multi-finger transistors satisfies the equation $$Wn = W0 * 10^{\frac{k*(2^N - 1 - n)}{20}} \text{ for}$$
$$n = 0, 1, \ldots (2^N - 1),$$

wherein Wn is the width of a transistor of an $n^{th}$ branch, W0 is a width of a basis transistor, N is the number of bits of the binary digits of an output level in dB and k are the gain steps in dB.

12. The amplifier arrangement of claim 11, wherein a width Wna satisfies the equation $$W - F(w) = 0,$$

wherein Wna is an approximate width of the transistor of a branch, W is a constant vector comprising the values Wn of the width of the transistors as components of W, and F(w) is a function which returns a vector.

13. An amplifier arrangement, comprising:
a control logic circuit;
a first branch, comprising:
a first multi-finger transistor comprising a first control terminal and a further control terminal, which are coupled to the control logic circuit, and configured to receive a first signal to the first control terminal and a further signal to the further control terminal, a first terminal coupled to a reference potential terminal, and a second terminal;
a second branch, comprising:
a second multi-finger transistor comprising a first control terminal and a further control terminal, which are coupled to the control logic circuit, and configured to receive a second signal to the first control terminal and a further signal to the further control terminal, a first terminal coupled to the reference potential terminal, and a second terminal;
a current combiner coupled to the second terminal of the first multi-finger transistor and the second terminal of the second multi-finger transistor, and configured to combine the currents associated with the first and second multi-fingered transistors, and provide the combined current to an output terminal of the amplifier arrangement;
a first switch configured to couple the control logic circuit to the further control terminal of the first-multi-finger transistor; and
a second switch configured to couple the control logic to the further control terminal of the second multi-finger transistor.

14. The amplifier arrangement of claim 13, further comprising:
a first inverter coupled between a first output terminal of the control logic circuit and the first control terminal of the first multi-finger transistor and, via the first switch, the further control terminal of the first multi-finger transistor; and
a second inverter coupled between a second output terminal of the control logic circuit and the first control terminal of the second multi-finger transistor and, via the second switch, the further control terminal of the second multi-finger transistor.

15. The amplifier arrangement of claim 13, further comprising:
a first cascode transistor coupled between the second terminal of the first multi-finger transistor and the current combiner; and
a second cascode transistor coupled between the second terminal of the second multi-finger transistor and the current combiner.

16. The amplifier arrangement of claim 13, wherein the current combiner comprises a balun.

17. A power amplifier, comprising:
a control signal generator configured to generate a first and a second signal, wherein the control signal generator comprises a control logic circuit, and wherein the first signal and the second signal are provided as digital signals by the control logic circuit;
a first amplifier comprising a first transistor and a first cascode transistor coupled together and configured to amplify the first signal;
a second amplifier comprising a second transistor and a second cascode transistor coupled together and configured to amplify the second signal; and
an output coupler which couples an output of the first amplifier and an output of the second amplifier to an output terminal of the amplifier arrangement.

18. The power amplifier of claim 17, wherein:
the first transistor is configured to receive the first signal and is coupled to the output coupler via the first cascode transistor; and
the second transistor is configured to receive the second signal and is coupled to the output coupler via the second cascode transistor.

19. The power amplifier of claim 17, wherein the output coupler comprises a current combiner configured to couple a terminal of the first cascode transistor and a terminal of the second cascode transistor to the output terminal of the amplifier arrangement, and thereby combine currents associated therewith at the output terminal.

20. A method for amplifying a signal, comprising:
feeding a first signal to a first branch of an amplifier arrangement;
feeding a second signal to a second branch of the amplifier arrangement;
amplifying the first signal collectively by a first transistor and a first cascode transistor of the first branch and providing a first amplified output signal;
amplifying the second signal collectively by a second transistor and a second cascode transistor of the second branch and providing a second amplified output signal; and
combining the first and second amplified output signals,
wherein the first and the second signals are provided as digital signals and the second signal has a phase difference of approximately 180 degrees with respect to the first signal.

21. A method for amplifying a signal, comprising:
feeding a first signal to a first branch of an amplifier arrangement;
feeding a second signal to a second branch of the amplifier arrangement;
amplifying the first signal collectively by a first transistor and a first cascode transistor of the first branch and providing a first amplified output signal;
amplifying the second signal collectively by a second transistor and a second cascode transistor of the second branch and providing a second amplified output signal;
feeding a third signal to a third branch of the amplifier arrangement;
feeding a fourth signal to a fourth branch of the amplifier arrangement;
amplifying the third signal collectively by a third transistor and a third cascode transistor of the third branch and providing a third amplified output signal;
amplifying the fourth signal collectively by a fourth transistor and a fourth cascode transistor of the fourth branch and providing a fourth amplified output signal; and
combining the first, second, third and fourth amplified output signals,
wherein the third signal has a phase difference of approximately 90 degrees with respect to the first signal, and wherein the fourth signal has a phase difference of approximately 270 degrees with respect to the first signal.

22. The method of claim 21, wherein the first and the second branch provide a first gain factor and the third and the fourth branch provide a second gain factor which is different from the first gain factor.

23. A method for amplifying a signal, comprising:
feeding a first signal to a first branch of an amplifier arrangement;
feeding a second signal to a second branch of an amplifier arrangement, wherein the first and second signals comprise digital signals;
amplifying the first signal by a first multi-finger transistor comprised by the first branch and providing a first amplified output signal;
amplifying the second signal by a second multi-finger transistor comprised by the second branch and providing a second amplified output signal; and
combining the first and second amplified output signals.

24. The method of claim 23, wherein the second signal has a phase difference of approximately 180 degrees with respect to the first signal.

25. The method of claim 23, wherein:
the first signal is provided to a first control terminal of the first multi-finger transistor;
the first signal is provided to a further control terminal of the first multi-finger transistor depending on a first control signal;
the second signal is provided to a first control terminal of the second multi-finger transistor; and
the second signal is provided to a further control terminal of the second multi-finger transistor depending on the first control signal.

26. A method for amplifying a signal, comprising:
feeding a first signal to a first branch of an amplifier arrangement;
feeding a second signal to a second branch of an amplifier arrangement;
amplifying the first signal by a first multi-finger transistor comprised by the first branch and providing a first amplified output signal;
amplifying the second signal by a second multi-finger transistor comprised by the second branch and providing a second amplified output signal; and combining the first and second amplified output signals designing the first and second multi-finger transistors in the amplifier arrangement, the designing comprising: calculating a width Wn according to the equation $$Wn = W0 * 10^{\frac{k*(2^N-1-n)}{20}} \text{ for}$$
$$n = 0, 1, \ldots (2^N - 1),$$

wherein Wn is the width of a transistor of an $n^{th}$ branch, W0 is a width of a basis transistor, N is the number of bits of the binary digits of an output level in dB and k are the gain steps in dB.

27. The method of claim 26, further comprising:
approximating a width Wna which satisfies the equation $$W - F(w) = 0,$$

wherein Wna is an approximate width of the transistor of a branch, W is a constant vector comprising the values Wn of the width of the transistors as components of W, and F(w) is a function which returns a vector.

* * * * *